(12) United States Patent
Noguchi

(10) Patent No.: US 8,420,528 B2
(45) Date of Patent: Apr. 16, 2013

(54) MANUFACTURING METHOD OF A SEMICONDUCTOR DEVICE HAVING WIRINGS

(75) Inventor: Junji Noguchi, Akishima (JP)

(73) Assignee: Hitachi, Ltd., Tokyo (JP)

( * ) Notice: Subject to any disclaimer, the term of this patent is extended or adjusted under 35 U.S.C. 154(b) by 431 days.

(21) Appl. No.: 12/605,327

(22) Filed: Oct. 24, 2009

(65) Prior Publication Data

US 2010/0130001 A1 May 27, 2010

(30) Foreign Application Priority Data

Oct. 28, 2008 (JP) .................................. 2008-276235

(51) Int. Cl.
*H01L 23/538* (2006.01)

(52) U.S. Cl.
USPC ........... 438/627; 438/620; 438/622; 438/638; 257/386; 257/E23.175; 257/E21.579; 257/E21.581; 257/E21.584

(58) Field of Classification Search .................. 438/607, 438/618, 620, 622, 625–627, 629, 631, 636–643, 438/648, 652–653, 666–675, 687; 257/386, 257/E23.175, E21.577–E21.579, E21.581–E21.586
See application file for complete search history.

(56) References Cited

U.S. PATENT DOCUMENTS

| | | | |
|---|---|---|---|
| 5,759,913 A * | 6/1998 | Fulford et al. ................ | 438/624 |
| 6,268,277 B1 * | 7/2001 | Bang .............................. | 438/619 |
| 6,300,242 B1 * | 10/2001 | Ueda et al. .................... | 438/638 |
| 6,399,476 B2 * | 6/2002 | Kim et al. ..................... | 438/619 |
| 6,524,948 B2 * | 2/2003 | Tamaoka et al. .............. | 438/637 |
| 7,042,095 B2 | 5/2006 | Noguchi et al. | |
| 7,473,632 B2 | 1/2009 | Ueda | |
| 7,501,347 B2 * | 3/2009 | Noguchi et al. .............. | 438/700 |
| 7,807,563 B2 * | 10/2010 | Gabric et al. ................. | 438/619 |
| 7,879,683 B2 * | 2/2011 | Al-Bayati et al. ............ | 438/422 |
| 8,053,901 B2 * | 11/2011 | Gambino et al. ............. | 257/774 |
| 2003/0077893 A1 * | 4/2003 | Demolliens et al. ......... | 438/622 |
| 2003/0183940 A1 * | 10/2003 | Noguchi et al. .............. | 257/767 |
| 2005/0101118 A1 * | 5/2005 | Kimura et al. ................ | 438/623 |
| 2005/0153505 A1 * | 7/2005 | Gambino et al. ............ | 438/233 |
| 2006/0088975 A1 * | 4/2006 | Ueda ............................. | 438/421 |
| 2006/0281298 A1 * | 12/2006 | Noguchi et al. .............. | 438/622 |
| 2007/0018330 A1 * | 1/2007 | Takeda et al. ................ | 257/762 |

(Continued)

FOREIGN PATENT DOCUMENTS

| | | |
|---|---|---|
| JP | 2003-297918 A | 10/2003 |
| JP | 2006-120988 A | 5/2006 |
| JP | 2006-344703 A | 12/2006 |

*Primary Examiner* — Matthew Landau
*Assistant Examiner* — Maliheh Malek
(74) *Attorney, Agent, or Firm* — Miles & Stockbridge P.C.

(57) ABSTRACT

Wirings mainly containing copper are formed on an insulating film on a substrate. Then, after forming insulating films for reservoir pattern and a barrier insulating film, an insulating film for suppressing or preventing diffusion of copper is formed on upper and side surfaces of the wirings, the insulating film on the substrate, and the barrier insulating film. Here, thickness of the insulating film for suppressing or preventing diffusion of copper at the bottom of a narrow inter-wiring space is made smaller than that on the wirings, thereby efficiently reducing wiring capacitance of narrow-line pitches. Then, first and second low dielectric constant insulating films are formed. Here, a deposition rate of the first insulating film at an upper portion of the side surfaces of facing wirings is made higher than that at a lower portion thereof, thereby forming air gaps. Finally, the second insulating film is planarized by interlayer CMP.

11 Claims, 29 Drawing Sheets

U.S. PATENT DOCUMENTS

| | | | |
|---|---|---|---|
| 2007/0087551 A1* | 4/2007 | Gambino et al. | 438/617 |
| 2008/0036092 A1* | 2/2008 | Gambino et al. | 257/774 |
| 2009/0106718 A1 | 4/2009 | Matsumoto et al. | |
| 2011/0042826 A1* | 2/2011 | Gambino et al. | 257/774 |
| 2011/0163364 A1* | 7/2011 | Kim et al. | 257/294 |

* cited by examiner

FIG. 1
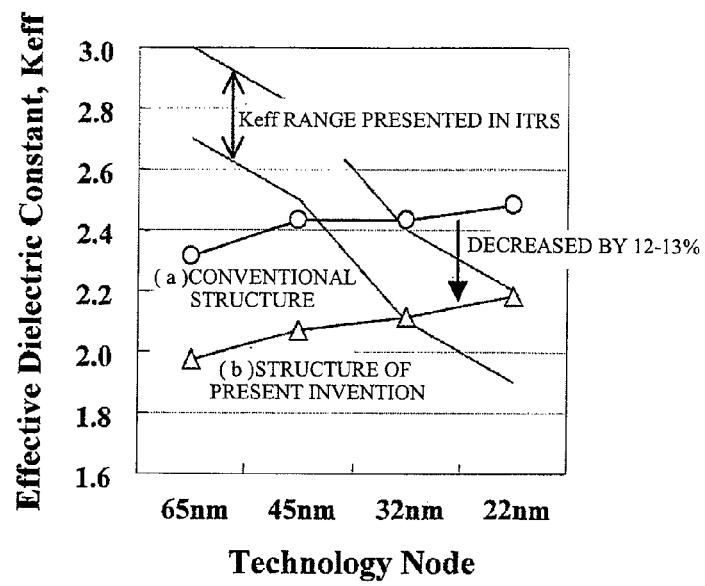
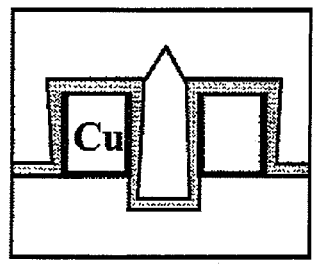
(a) WITH SiCN BARRIER INSULATING FILM AT BOTTOM OF AIR GAP
(CONVENTIONAL STRUCTURE)
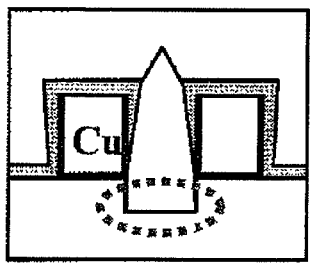
(b) WITHOUT SiCN BARRIER INSULATING FILM AT BOTTOM OF AIR GAP
(STRUCTURE OF PRESENT INVENTION)

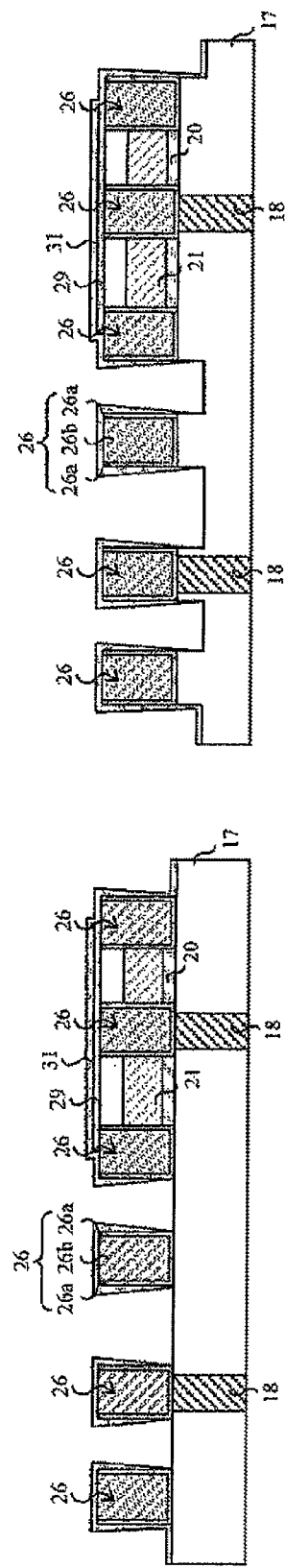

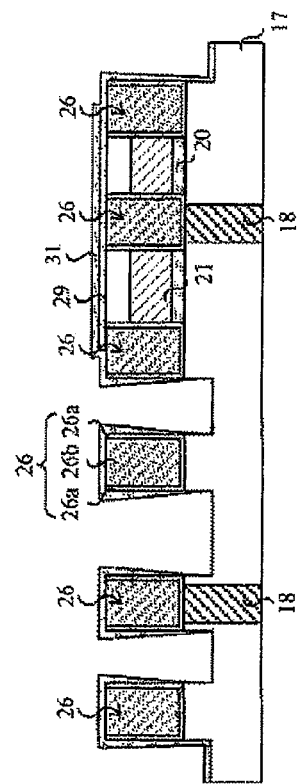
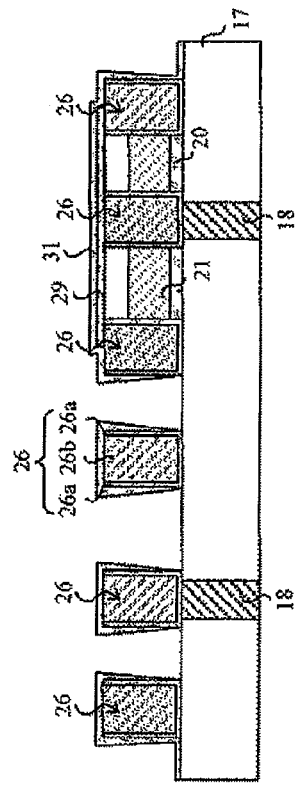
FIG. 16A
FIG. 16B

MANUFACTURING METHOD OF A SEMICONDUCTOR DEVICE HAVING WIRINGS

CROSS-REFERENCE TO RELATED APPLICATION

The present application claims priority from Japanese Patent Application No. JP 2008-276235 filed on Oct. 28, 2008, the content of which is hereby incorporated by reference into this application.

TECHNICAL FIELD OF THE INVENTION

The present invention relates to a semiconductor device and a manufacturing technique thereof, and in particular to a technique effectively applied to a semiconductor device having wirings including a main conductive film containing copper as a main component.

BACKGROUND OF THE INVENTION

The buried wiring structure is formed by burying a wiring material in a wiring opening such as a wiring trench or hole formed in an insulating film with a wiring formation technique referred to as Damascene technique (Single-Damascene technique and Dual-Damascene technique). However, when a material of the main wiring is copper (Cu), Cu tends to be diffused into an insulating film compared with a metal such as aluminum (Al). For this reason, in order to prevent the buried wiring made of copper from directly making contact with the insulating film, the surface (bottom and side surfaces) of the buried wiring is covered with a thin barrier metal film, thereby suppressing or preventing copper in the buried wiring from being diffused into the insulating film. Also, a barrier insulating film as a wiring cap made of, for example, a silicon nitride film is formed on an upper surface of the insulating film having a wiring opening formed therein to cover the upper surface of the buried wiring, thereby suppressing or preventing copper in the buried wiring from being diffused from the upper surface of the buried wiring into the insulating film.

In recent years, intervals between the buried wirings have been decreased with the increase in integration degree of a semiconductor device. This increases parasite capacitance between wirings to cause a signal delay, so that cross talk occurs between adjacent wirings. For this reason, it is desired to reduce the parasite capacitance between wirings. For the reduction of the parasite capacitance between wirings, a low dielectric-constant material is used for an inter-wiring insulating film. Meanwhile, for example, Japanese Patent Application Laid-Open Publication No. 2003-297918 (Patent Document 1) discloses a technique of forming each wiring in a tapered shape and also forming an air gap between these wirings. By means of this air gap, inter-wiring capacitance is reduced. Also, in Japanese Patent Application Laid-Open Publication No. 2006-120988 (Patent Document 2), the interlayer insulating film is etched deeper than the bottom of the wirings to further reduce the capacitance.

SUMMARY OF THE INVENTION

However, the result of studies by the inventor has found that the following problems arise in the above-mentioned buried wiring technique using copper as a main conductive layer.

Patent Document 1 shows that the capacitance is reduced by adopting an air-gap structure, compared with a normal Damascene structure. However, according to the studies by the inventor, in a conventional structure depicted in (a) of FIG. 1 where a barrier insulating film is present on the bottom of an air gap, it is difficult to achieve an effective dielectric constant presented in International Technology Roadmap for Semiconductors (ITRS) in the next generation of 32 nm nodes onward. By contrast, according to the studies by the inventor, in a structure according to the present invention depicted in (b) of FIG. 1, that is, in a structure where no barrier insulating film is present on the bottom of the air gap, a capacitance reduction effect of approximately 12% to 13% is obtained by removing just a slight barrier insulating film, so that an effective dielectric constant desired for 32 nm nodes onward can be achieved.

Patent Document 2 discloses an example where an inter-wiring insulating film is formed deeper than the bottom of a trench. In Patent Document 2, however, no consideration is given to the measures for reducing capacitance variations. Depth variations become more conspicuous as the etching becomes deeper, and it causes an increase in capacitance variations. In the present invention, a through-hole interlayer insulating film made of a material different from that of the inter-wiring insulating film is formed at a depth-direction position in which the air gap is desired to be formed, and etching for the removal of the inter-wiring insulating film is stopped by a via interlayer insulating film. By this means, the capacitance variations can be more reduced compared with the conventional structure.

An object of the present invention is to provide a semiconductor device capable of reducing capacitance between wirings having a main conductive layer made of copper, and a manufacturing method of the semiconductor device.

The above and other objects and novel characteristics of the present invention will be apparent from the description of this specification and the accompanying drawings.

The typical ones of the inventions disclosed in this application will be briefly described as follows.

A manufacturing method of a semiconductor device according to the present invention includes the following steps of:

(a) forming a plurality of wiring trenches in a first insulating film on a semiconductor substrate;

(b) forming a first conductive film on the first insulating film including respective insides of the plurality of wiring trenches;

(c) forming wirings formed of the first conductive film inside the respective wiring trenches by removing a portion of the first conductive film outside the wiring trenches by CMP;

(d) forming a first barrier insulating film on the first insulating film and the wirings;

(e) forming a reservoir position by removing the first barrier insulating film and the first insulating film except portions of the first barrier insulating film and the first insulating film in lower regions and their peripheral regions of through holes, which are formed later and from which upper surfaces of the wirings are exposed;

(f) forming a second barrier insulating film on the first barrier insulating film and side and upper surfaces of the wirings so that the second barrier insulating film on spaces between the wirings is made thinner than the second barrier insulating film on the wirings;

(g) forming a second insulating film on the second barrier insulating film while leaving gaps in space regions between the wirings from which the first barrier insulating film and the first insulating film have been removed;

(h) forming through holes penetrating through the first barrier insulating film, the second barrier insulating film and the second insulating film on an upper portion of the wirings; and (i) forming a second conductive film inside the through holes.

Another manufacturing method of a semiconductor device according to the present invention includes the following steps of:

(a') forming a plurality of wiring trenches in a first insulating film and a second insulating film on a semiconductor substrate;

(b') forming a first conductive film on the second insulating film including respective insides of the plurality of wiring trenches;

(c') forming wirings formed of the first conductive film inside the respective wiring trenches by removing a portion of the first conductive film outside the wiring trenches by CMP;

(d') forming a first barrier insulating film on the second insulating film and the wirings;

(e') forming a reservoir position by removing the first barrier insulating film and the second insulating film except portions of the first barrier insulating film and the second insulating film in lower regions and their peripheral regions of through holes, which are formed later and from which upper surfaces of the wirings are exposed;

(f) forming a second barrier insulating film on the first barrier insulating film and side and upper surfaces of the wirings so that the second barrier insulating film on spaces between the wirings is made thinner than the second barrier insulating film on the wirings;

(g') forming a third insulating film on the second barrier insulating film while leaving gaps in space regions between the wirings from which the first barrier insulating film and the second insulating film have been removed;

(h') forming through holes penetrating through the first barrier insulating film, the second barrier insulating film and the third insulating film on an upper portion of the wirings; and (i) forming a second conductive film inside the through holes.

In the above, the combined structure of the first insulating film and the second insulating film is characterized by having high selectivity in dry etching. By this means, when the second insulating film is removed after forming wirings, the first insulating film serves as a stopper film, and a shape with the uniform etching depth can be obtained. Therefore, an air-gap shape formed thereafter has a similar structure, and air-gap wirings with less capacitance variations can be formed.

The effects obtained by typical embodiments of the inventions disclosed in this application will be briefly described below.

Compared with the conventional air-gap structure, the capacitance and capacitance variations can be further reduced.

BRIEF DESCRIPTIONS OF THE DRAWINGS

FIG. 1 is a diagram depicting an effective dielectric-constant reduction effect when an embodiment of the present invention is used;

FIG. 10A is a cross-sectional view of principal parts in the manufacturing process of a semiconductor device continued from FIG. 9A;

FIG. 10B is a cross-sectional view of principal parts in the manufacturing process of a semiconductor device continued from FIG. 9B;

FIG. 16A is a cross-sectional view of principal parts in the manufacturing process of a semiconductor device continued from FIG. 15A;

FIG. 16B is a cross-sectional view of principal parts in the manufacturing process of a semiconductor device continued from FIG. 15B;

DESCRIPTIONS OF THE PREFERRED EMBODIMENTS

Hereinafter, embodiments of the present invention will be described in detail with reference to the accompanying drawings. Note that components having the same function are denoted by the same reference numbers throughout the drawings for describing the embodiments, and the repetitive description thereof will be omitted. In addition, the description of the same or similar portions is not repeated in principle unless particularly required in the following embodiments.

(First Embodiment)

Figure 2:
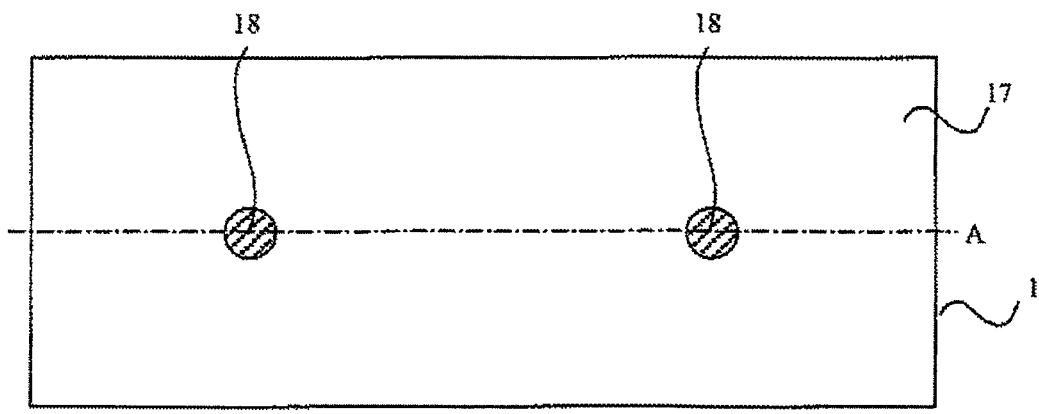
FIG. 2 is a plan view of principal parts in the manufacturing process of a semiconductor device according to an embodiment of the present invention.
Figure 3:
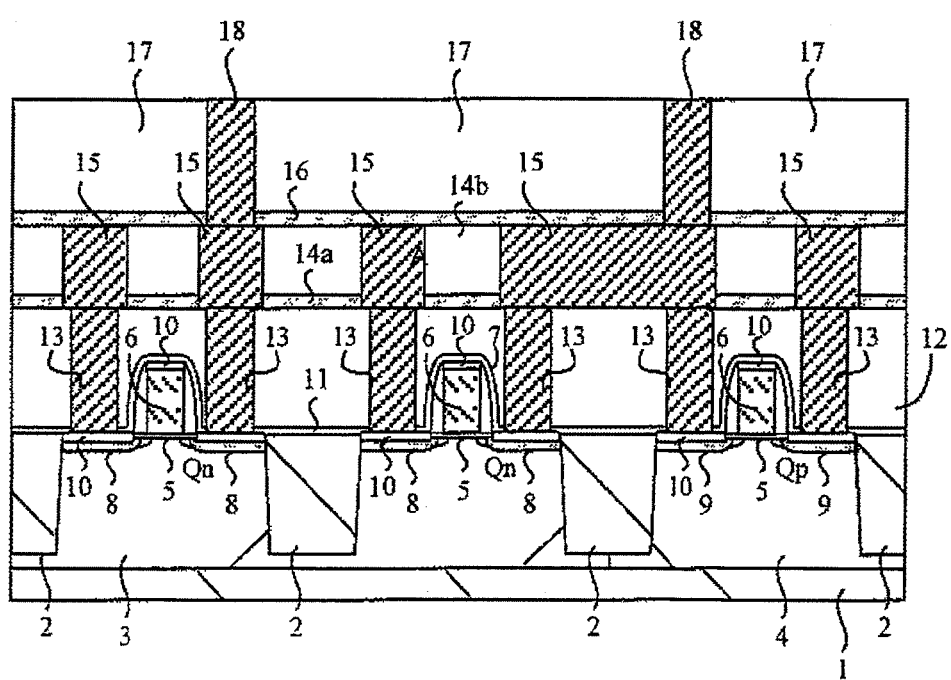
FIG. 3 is a cross-sectional view of an A-A line in FIG. 2.

A semiconductor device and a manufacturing method thereof according to a first embodiment will be described with reference to the drawings. FIG. 2 is a plan view of principal parts in the manufacturing process of a semiconductor device, for example, Complementary Metal Insulator Semiconductor Field Effect Transistor (CMISFET) according to an embodiment of the present invention. FIG. 3 is a cross-sectional view of an A-A line in FIG. 2. As depicted in FIGS. 2 and 3, a wafer or semiconductor substrate 1 made of p-type monocrystalline silicon having a resistivity of, for example, 1 Ωcm to 10 Ωcm has isolation regions 2 formed on its main surface. The isolation regions 2 are made of silicon oxide or the like and are formed by, for example, Shallow Trench Isolation (STI) or LOCOS (Local Oxidization of Silicon).

The semiconductor substrate 1 has a p-type well 3 and an n-type well 4 formed from its main surface to a predetermined depth. The p-type well 3 is formed by, for example, ion-implanting impurities such as boron, and the n-type well 4 is formed by, for example, ion-implanting impurities such as phosphorus.

In the region of the p-type well 3, an n-channel MISFET (Qn) is formed in an active region surrounded by the isolation regions 2. Also, in the region of the n-type well 4, a p-channel MISFET (Qp) is formed in an active region surrounded by the isolation regions 2. Gate insulating films 5 of the n-type MISFET (Qn) and the p-type MISFET (Qp) are formed of, for example, a thin silicon oxide film or silicon oxynitride film, and are formed by, for example, thermal oxidation.

Gate electrodes 6 of the n-type MISFET (Qn) and the p-type MISFET (Qp) are formed by stacking, for example, a titanium silicide ($TiSi_x$) layer or cobalt silicide ($CoSi_x$) layer 10 on a low-resistance polycrystalline silicon film. A side-wall spacer or side wall 7 made of, for example, silicon oxide is formed on the side wall of the gate electrode 6.

Also, n-type semiconductor regions 8 which are source and drain regions of the n-type MISFET (Qn) are formed by ion-implanting impurities such as phosphorus into both side regions of the gate electrode 6 and the side wall 7 of the p-type well after the formation of the side wall 7. Then, p-type semiconductor regions 9 which are source and drain regions of the p-type MISFET (Qp) are formed by ion-implanting impurities such as boron into both side regions of the gate electrode 6 and the side wall 7 of the n-type well 4 after the formation of the side wall 7. Further, on a part of the upper surface of the n-type semiconductor region 8 and the p-type semiconductor region 9, a silicide layer 10 such as a titanium silicide layer or a cobalt silicide layer is formed.

On the above-described semiconductor substrate 1, a silicon nitride film 11 is formed so as to cover the gate electrode 6 and the side wall 7. Also, an insulating film 12 formed thereon is made of an insulating film with high reflow properties such as a Boron-doped Phospho Silicate Glass (BPSG) film capable of filling narrow spaces between the gate electrodes 6. In the insulating film 12, contact holes 13 are formed. At the bottom of the contact holes 13, a part of a main surface of the semiconductor substrate 1, for example, a part of the n-type semiconductor region 8, a part of the p-type semiconductor region 9, and a part of the gate electrode 6 is exposed.

In each of these contact holes 13, a conductive film made of tungsten (W) or the like is formed. The conductive film is formed by, for example, forming a titanium nitride film, forming a tungsten film on the titanium nitride film by Chemical Vapor Deposition (CVD) so as to fill the contact holes 13, and then removing unnecessary portions of the tungsten film and the titanium nitride film on the insulating film 12 by Chemical Mechanical Polishing (CMP) or etch-back.

On the insulating film 12 having the contact holes 13 embedded therein, first layer wirings 15 are formed by the Damascene technique in which, after trenches are formed in an interlayer insulating film formed of, for example, an insulating film 14a and an insulating film 14b, the trenches are each filled with a conductive film made of tungsten or the like and then an excess of the conductive film is removed by CMP. The first layer wirings 15 are electrically connected via the contact holes 13 to the semiconductor regions 8 and 9 for sources and drains and the gate electrodes 6 of the n-type MISFET (Qn) and the p-type MISFET (Qp). The first layer wirings 15 are not limited to tungsten and various modifications can be made therein. For example, the first layer wirings 15 may be made of a single-element film of any one of aluminum (Al) and aluminum alloy or a stacked metal film obtained by forming a metal film made of titanium (Ti), titanium nitride (TiN) or the like on at least one of upper and lower layers of the single-element film.

When a trench is processed by the Damascene technique, the insulating film 14a serves as an etching stopper film, so that the resistance variations can be reduced. For example, a silicon nitride ($Si_xN_y$) film, a silicon carbide (SiC) film or a silicon carbonitride (SiCN) film may be used as the insulating film 14a. The silicon nitride film, silicon carbide film or silicon carbonitride film can be formed by, for example, plasma CVD. An example of the silicon carbide film formed by plasma CVD is BLOk (manufactured by AMAT, relative permittivity=4.3 to 5.0). In its formation, mixed gas of trimethylsilane and helium (or $N_2$, $NH_3$) is used.

For the insulating film 14b, a silicon oxide film (for example, Tetraethoxysilane (TEOS) oxide film) is used. Furthermore, for the reduction of the inter-wiring capacitance, the insulating film 14b is made of, for example, a low dielectric-constant material (so-called Low-K insulating film or Low-K material) such as organic polymer or organic silica glass. An example of the low dielectric-constant insulating film (Low-K insulating film) can be an insulating film with a dielectric constant lower than the dielectric constant of a silicon oxide film (for example, TEOS oxide film) included in a passivation film. In general, an insulating film with a dielectric constant approximately equal to or lower than the dielectric constant of the TEOS oxide film ∈=4.1 to 4.2 is called a low dielectric-constant insulating film.

Examples of the organic polymer as the low dielectric-constant material include SiLK (manufactured by The Dow Chemical Co., relative permittivity=2.7, heatproof temperature=490° C. or higher, dielectric breakdown withstand voltage=4.0 to 5.0 MV/Vm) and FLARE of a polyallyl ether (PAE) material (manufactured by Honeywell Electronic Materials Co., relative permittivity=2.8, heatproof temperature=400° C. or higher). This PAE material has features of offering high basic performance, excellent mechanical strength and thermal stability, and excellent cost effectiveness. Examples of the organic silica glass (SiOC materials) as a low dielectric-constant material include HSG-R7 (manufactured by Hitachi Chemical Co. Ltd., relative permittivity=2.8, heatproof temperature=650° C.), Black Diamond (manufactured by Applied Materials, Inc. of USA, relative permittivity=3.0 to 2.4, heatproof temperature=450° C.), and p-MTES (manufactured by Hitachi Kaihatsu, relative permittivity=3.2). Other SiOC materials include, for example, CORAL (manufactured by Novellus Systems, Inc. of USA, relative permittivity=2.7 to 2.4, heatproof temperature=500° C.) and Aurora 2.7 (manufactured by ASM Japan K. K., relative permittivity=2.7, heatproof temperature=450° C.).

Further, for example, an FSG (SiOF-based material), HSQ (hydrogen silsesquioxane) material, MSQ (methyl silsesquioxane) material, porous HSQ material, porous MSQ material, or porous organic material may also be used as a low dielectric-constant material of the insulating film 14b. Examples of the HSQ material include OCD T-12 (manufactured by Tokyo Ohka Kogyo Co., Ltd., relative permittivity=3.4 to 2.9, heatproof temperature=450° C.), FOx (manufactured by Dow Corning Corp., relative permittivity=2.9), and OCL T-32 (manufactured by Tokyo Ohka Kogyo Co., Ltd., relative permittivity=2.5, heatproof temperature=450° C.). Examples of the MSQ material include OCD T-(manufactured by Tokyo Ohka Kogyo Co., Ltd., relative permittivity=2.7, heatproof temperature=600° C.), LKD-T200 (manufactured by JSR Co. relative permittivity=2.7 to 2.5, heatproof temperature=450° C.), HOSP (manufactured by Honeywell Electronic Materials, relative permittivity=2.5, heatproof temperature=550° C.), HSG-RZ25 (manufactured by Hitachi Chemical Co., Ltd., relative permittivity=2.5, heatproof temperature=650° C.), OCL T-31 (manufactured by Tokyo Ohka Kogyo Co., Ltd., relative permittivity=2.3, heatproof temperature=500° C.), and LKD-T400 (manufactured by JSR Co., relative permittivity=2.2 to 2, heatproof temperature 450° C.).

Examples of the porous HSQ material include XLK (manufactured by Dow Corning Corp. of USA, relative permittivity=2.5 to 2), OCL T-72 (manufactured by Tokyo Ohka Kogyo Co., relative permittivity=2.2 to 1.9, heatproof temperature=450° C.), Nanoglass (manufactured by Honeywell Electronic Materials, relative permittivity=2.2 to 1.8, heatproof temperature=500° C. or higher), and MesoELK (manufactured by Air Products and Chemicals, Inc., relative permittivity=2 or lower). Examples of the porous MSQ material include HSG-6211X (manufactured by Hitachi Chemical Co., Ltd., relative permittivity=2.4, heatproof temperature=650° C.), ALCAP-S (manufactured by Asahi Kasei Corporation, relative permittivity=2.3 to 1.8, heatproof temperature=450° C.), OCLT-77 (manufactured by Tokyo Ohka Kogyo Co., Ltd., relative permittivity=2.2 to 1.9, heatproof temperature=600° C.), HSG-6210X (manufactured by Hitachi Chemical Co., Ltd., relative permittivity=2.1, heatproof temperature=650° C.), and silica aerogel (manufactured by Kobe Steel Ltd., relative permittivity=1.4 to 1.1). Examples of the porous organic material include PolyELK (manufactured Air Products and Chemicals, Inc., relative permittivity=2 or smaller, heatproof temperature=490° C.). The SiOC and SiOF materials described above are formed by, for example, CVD. By way of example, Black Diamond described above is formed by CVD using mixed gas of trimethylsilane and oxygen. Also, the p-MTES described above is formed by, for example, CVD using mixed gas of methyltriethoxysilane and $N_2O$. Other low dielectric-constant insulating materials are formed by, for example, the coating method.

When such a Low-K material is used, an insulating film as a Low-K cap is required in some cases on the insulating film 14b. For the insulating film as a Low-K cap, for example, a silicon oxide ($SiO_x$) film typified by silicon dioxide ($SiO_2$) or a pSiOC film with a relatively high film strength is used. Such a Low-K cap film has functions of, for example, ensuring mechanical strength of the insulating film 14b, protecting the surface, and ensuring resistance to moisture in the CMP process.

On the first layer wirings 15, an inter-through-hole-layer structure made of insulating films 16 and 17 is provided, and the insulating films 16 and 17 can be fabricated using the same method and material as those of the insulating films 14a and 14b in the same manner as the fabrication of the first layer wirings 15. In these insulating films 16 and 17, via or through holes 18 from which a part of the first layer wirings is exposed are formed. These through holes 18 are each filled with a conductive film made of, for example, tungsten.

Figure 4:
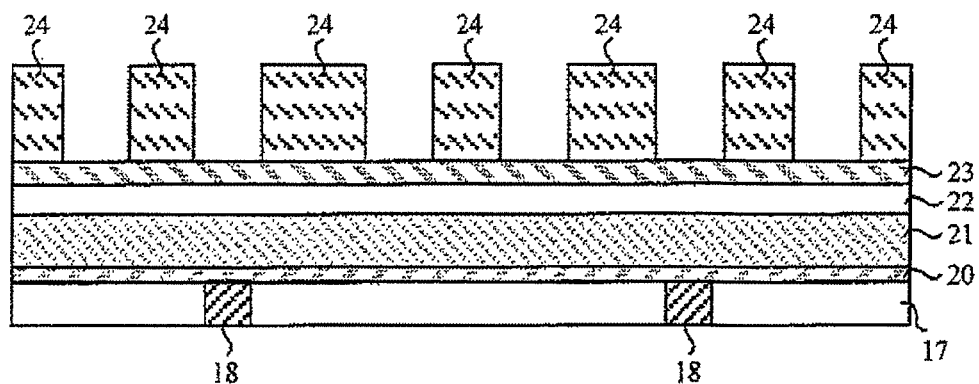
FIG. 4 is a cross-sectional view of principal parts in the manufacturing process of a semiconductor device continued from FIG. 3.
Figure 5:
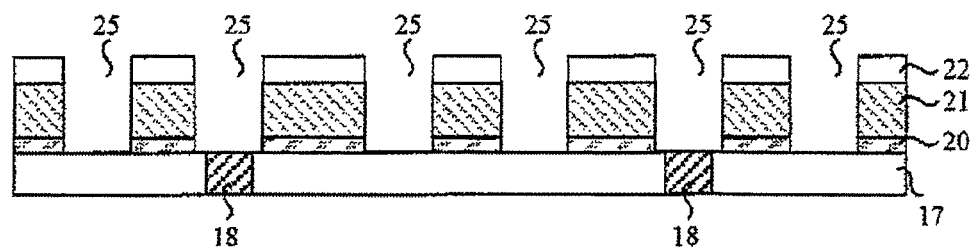
FIG. 5 is a cross-sectional view of principal parts in the manufacturing process of a semiconductor device continued from FIG. 4.
Figure 6:
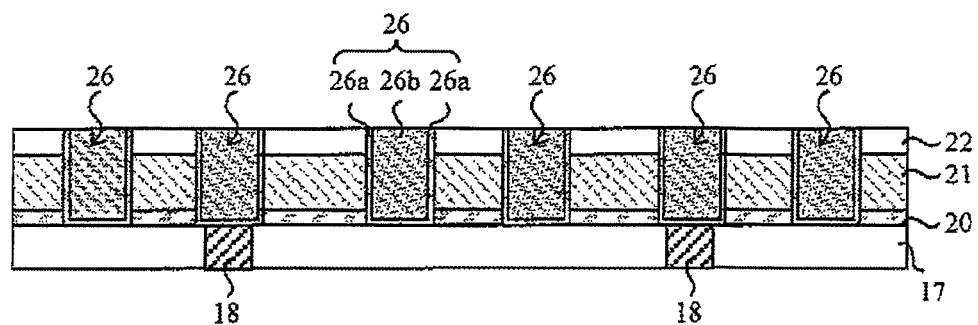
FIG. 6 is a cross-sectional view of principal parts in the manufacturing process of a semiconductor device continued from FIG. 5.

FIGS. 4 to 6 are cross-sectional views of principal parts in the manufacturing process of a semiconductor device continued from FIG. 2. In FIGS. 4 to 6, for easy understanding, the illustration of portions corresponding to the structure below the insulating film 17 in FIG. 3 is omitted.

First, in the present embodiment, as depicted in FIG. 4, an insulating film 20 is formed by plasma CVD or the like on the insulating film 17 having the through holes 18 embedded therein. The insulating film 20 is made of a silicon nitride film formed by, for example, plasma CVD, and has a thickness of, for example, approximately 25 nm to 50 nm. As another material for the insulating film 20, a single-element film of any one of a silicon carbide film formed by, for example, plasma CVD, an SiCN film formed by plasma CVD, and a silicon oxynitride (SiON) film formed by plasma CVD may be used. When any of these films is used, the dielectric constant can be significantly reduced compared with a silicon nitride film, and therefore, wiring capacitance can be reduced, and the operation speed of the semiconductor device can be improved. An example of the silicon carbide film formed by plasma CVD is BLOk (manufactured by AMAT). Also, for the formation of an SiCN film, for example, mixed gas of helium (He), ammonium ($NH_3$) and trimethylsilane (3MS) is used. Also, an example of the silicon oxynitride film formed by plasma CVD is PE-TMS (manufactured by Canon, relative permittivity=3.9), and for the formation thereof, for example, mixed gas of trimethoxysilane (TMS) gas and nitrogen oxide ($N_2O$) gas is used.

Next, an insulating film 21 is formed on the insulating film 20. As the insulating film 21, a Low-K insulating film made of the above-described Low-K material, that is, an SiOF film or an SiOC film is used. Also, for an insulating film 22 formed to be a cap on the insulating film 21, for example, a silicon oxide film is used. Alternatively, for the simplification of the process, a single-element film of silicon oxide or SiOC can be used for the insulating film 21 by omitting the insulating film 22.

Next, a reflection preventive film 23 and a photo-resist film are sequentially formed on the insulating film 22, and the photo-resist film is patterned by exposure to form a photo-resist pattern 24. Then, by the dry-etching using the photo-resist pattern 24 as an etching mask, the reflection preventive film 23 is selectively removed. Thereafter, by the dry-etching using the photo-resist pattern 24 as an etching mask, the insulating films 22 and 21 are selectively removed to form openings. Then, ashing is performed to remove the photo-resist pattern 24 and the reflection preventive film 23, and finally, the insulating film 20 exposed from the openings of the insulating films 22 and 21 are etched. In this manner, as depicted in FIG. 5, openings or wiring trenches 25 are formed. From the bottom surfaces of the wiring trenches 25, the upper surfaces of the plugs (through holes) 18 are exposed. Alternatively, it is also possible to selectively remove the insulating films 20, 21 and 22 by the dry-etching using the photo-resist pattern 24 as an etching mask to form the openings or wiring trenches 25, and then, remove the photo-resist pattern 24 and the reflection preventive film 23.

Next, as depicted in FIG. 6, a thin conductive barrier film (first conductive film) 26a having a thickness of approximately 5 nm to 50 nm and made of, for example, titanium nitride (TiN) is formed over the entire main surface of the substrate 1 by using sputtering. The conductive barrier film 26a has functions of, for example, preventing the diffusion of copper for forming a main conductive film described further below and improving wettability of copper at the time of reflow of the main conductive film. As a material for the conductive barrier film 26a, a high-melting metal nitride such as tungsten nitride (WN) or tantalum nitride (TaN) which hardly reacts with copper can be used in place of titanium nitride. Also, as a material for the conductive barrier film 26a, a material obtained by adding silicon (Si) to a high-melting metal nitride, a high-melting metal unlikely to react with copper such as tantalum (Ta), titanium (Ti), tungsten (W) or titanium tungsten (TiW) alloy, and a TaN/Ta stacked barrier obtained by combining TaN with high adhesion to an insulating film and Ta with high Cu wettability can be used.

Subsequently, a relatively-thick main conductive film (second conductive film) 26b having a thickness of, for example, approximately 800 nm to 1600 nm and made of copper is formed on the conductive barrier film 26a. The main conductive film 26b can be formed by using, for example, CVD, sputtering, or plating. Thereafter, the substrate 1 is subjected to a heat treatment in a non-oxidation atmosphere (for example, hydrogen atmosphere or nitrogen atmosphere) at, for example, approximately 150 to 400° C. to reflow the main conductive film 26b, thereby tightly filling the wiring trenches 25 with copper.

Next, the main conductive film 26b and the conductive barrier film 26a are polished by CMP. By this means, as depicted in FIG. 6, second layer wirings (wirings) 26 formed of the relatively-thin conductive barrier film 26a and the relatively-thick main conductive film 26b are formed in the wiring trenches 25. These second layer wirings 26 are electrically connected to the first layer wirings 15 via the plugs 18.

Figure 7:
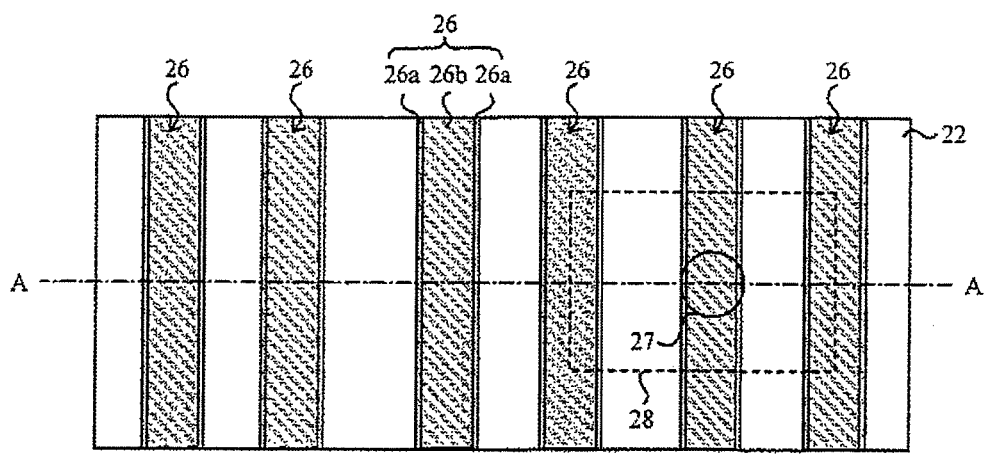
FIG. 7 is a plan view of principal parts in a region corresponding to FIG. 6.

FIG. 7 is a plan view of principal parts in a region corresponding to FIG. 6. FIG. 7 depicts the second layer wirings 26 and a formation position 27 of a through hole connected to the second layer wiring 26 and an upper layer thereof. When this through hole position is misaligned by an exposing apparatus in a lithography process and a gap (air gap) is present at a lower portion of the through hole, cleaning solution and Cu plating solution penetrate through thereafter, so that problems such as electrical connection failure and capacitance increase are caused. Therefore, as the measures for the misaligned through hole (misalignment of the through hole), a reservoir formation position 28 has to be set so that a reservoir of an insulating film is present at the bottom of the via to attain a normal interlayer structure even when misalignment occurs. Reservoir formation methods will be described with reference to FIG. 8 and subsequent figures.

Figure 8:
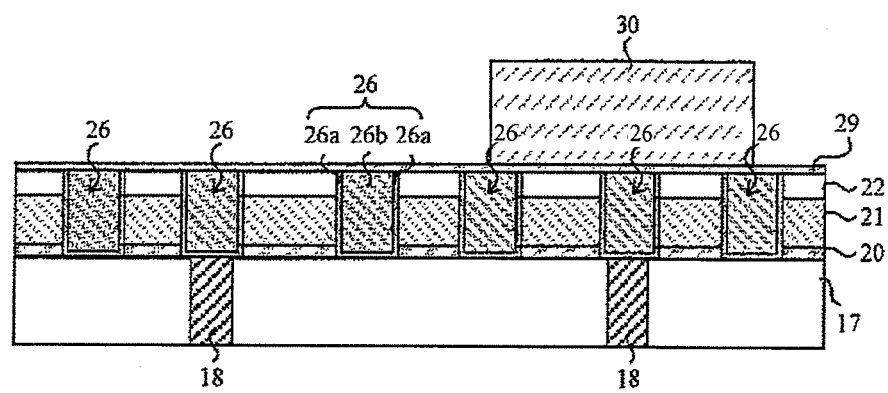
FIG. 8 is a cross-sectional view of an A-A line in FIG. 7 continued from FIG. 7.

FIG. 8 is a cross-sectional view of an A-A line in FIG. 7 continued from FIG. 7. Also in FIG. 8, the illustration of portions corresponding to the structure below the insulating film 17 in FIG. 3 is omitted. A barrier insulating film 29 having a thickness of 20 nm to 50 nm is formed on the insulating film 22 and the second layer wirings 26. The barrier insulating film 29 is made of, for example, a silicon nitride film, and it functions as a barrier insulating film for copper wirings. Therefore, the barrier insulating film 29 suppresses or prevents copper in the main conductive film 26b in each second layer wiring 26 from being diffused into an interlayer insulating film 36 formed later. As another material for the barrier insulating film 29, for example, a single-element film of any one of a silicon carbide (SiC) film, a silicon carbonitride (SiCN) film, and a silicon oxynitride (SiON) film may be used. When any of these films is used, the dielectric constant can be significantly reduced compared with a silicon nitride film, and therefore, wiring capacitance can be reduced, and the operation speed of the semiconductor device can be improved. An example of the silicon carbide film formed by plasma CVD is BLOk (manufactured by AMAT), and its film formation gas is as described above. For the formation of the SiCN film, for example, mixed gas of helium (He), ammonium ($NH_3$) and trimethylsilane (3MS) is used. Also, an example of the silicon oxynitride film formed by plasma CVD is PE-TMS (manufactured by Canon, relative permittivity=3.9). For the formation of the silicon oxynitride film, for example, mixed gas of trimethoxysilane (TMS) gas and nitrogen oxide ($N_2O$) gas is used.

Thereafter, photo-resist films are sequentially formed on the barrier insulating film 29, and the photo-resist films are patterned by exposure to form a photo-resist pattern 30. At this time, the barrier insulating film 29 functions as a reflection preventive film for the photo-resist pattern 30 and the copper wirings 26. At the time of the formation of such a reservoir layer, in order to further increase the accuracy, a reflection preventive film can be used at the bottom of the photo-resist film and on an upper portion of the barrier insulating film 29. As described above, the structure in which at least one insulating film layer is inserted between the photo-resist pattern for reservoir and the lower wirings is important.

Figure 9A:
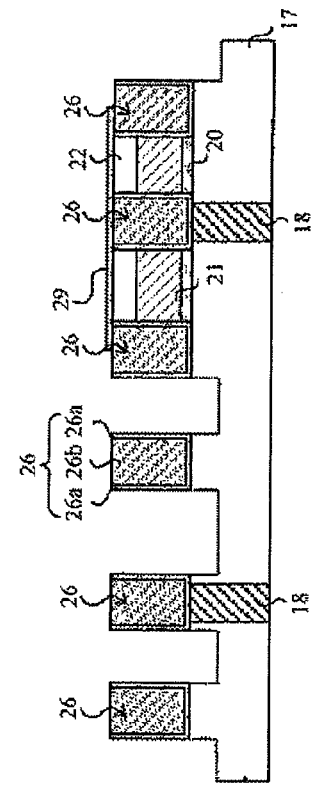
FIG. 9A is a cross-sectional view of principal parts in the manufacturing process of a semiconductor device continued from FIG. 8.

Then, by the dry-etching using the photo-resist pattern 30 as an etching mask, the insulating films 29, 22, 21 and 20 are selectively removed to form openings (FIG. 9A). At this time, the semiconductor substrate 1 is placed in a process chamber of a plasma CVD apparatus, and $CF_4$ gas is introduced to apply plasma power supply, thereby performing the $CF_4$ plasma process to the substrate 1 (in particular, CMP surface where the second layer wirings 26 are exposed) and removing the insulating films 29, 22, 21 and 20. After the $CF_4$ plasma process, an organic byproduct and a fluorinated byproduct are temporarily and slightly produced on the Cu wiring surface of the film 26b, but they can be removed by post-cleaning performed thereafter (for example, organic-acid cleaning, hydrofluoric acid cleaning, organic alkaline cleaning, or cleaning with a mixed fluid thereof) or by a hydrogen annealing process. Also, when an organic film containing no silicon such as SiLK is used as the insulating film 21, reducing plasma such as ammonium or N2/H2 mixed gas is used for the etching of the insulating film 21. Here, the plasma process indicates a process in which a surface of a substrate or a surface of a member when a member such as an insulating film or a metal film is formed on the substrate is exposed to an environment in a plasma state and the surface is processed by providing a chemical and mechanical (bombardment) effect of the plasma onto the surface. Also, plasma in a reducing atmosphere indicates a plasma environment in which reactive species such as radicals, ions, atoms and molecules having a reducing effect, that is, an effect of drawing oxygen are dominantly present. Furthermore, for the reduction of wiring capacitance more than FIG. 9A, the structure in which the insulating film 17 is removed more deeply than the bottom of the wirings can be formed as depicted in FIG. 9B.

Figure 9B:
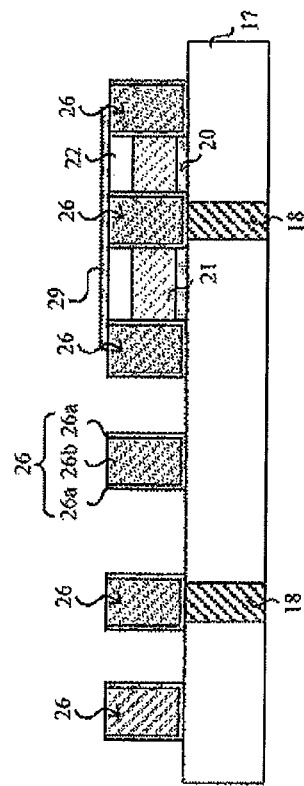
FIG. 9B is a cross-sectional view of principal parts in the manufacturing process of a semiconductor device continued from FIG. 8.

FIGS. 10A and 10B are cross-sectional views of principal parts in the manufacturing process of a semiconductor device continued from FIGS. 9A and 9B, respectively. Also in FIGS. 10A and 10B, the illustration of the portions corresponding to the structure below the insulating film 17 in FIG. 3 is omitted. After the insulating films 22, 21 and 20 are removed, post-cleaning and hydrogen annealing process are performed, and then, an insulating film 31 is formed over the entire main surface of the semiconductor substrate 1 by plasma CVD or the like. More specifically, the insulating film 31 with a thickness of 20 nm to 50 nm is formed so as to cover the upper surface and side surface of each of the second layer wirings 26, the barrier insulating film 29 for use in the formation of the reservoir, and the insulating film 17. At this time, the insulating film 31 is formed under the condition that the insulating film 31 is not formed in a conformal manner in a space between nearest wirings (minimum space between adjacent wirings or minimum pitch between wirings). Here, the nearest wirings correspond to the adjacent wirings having the minimum space therebetween in the wirings of the same layer (distance between adjacent wirings). In the space between nearest wirings, the reduction in parasite capacitance is more important.

Figure 11A:
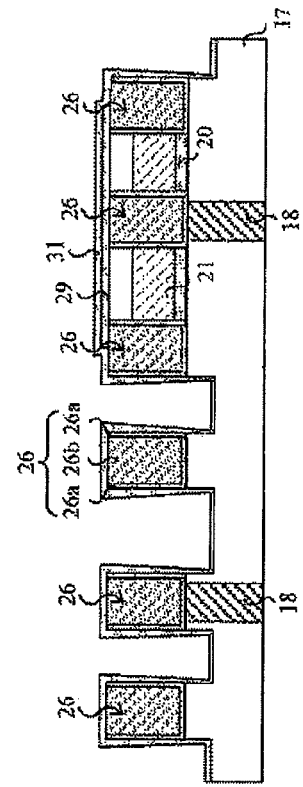
FIG. 11A is a cross-sectional view of principal parts in the manufacturing process of a semiconductor device continued from FIG. 10A.
Figure 11B:
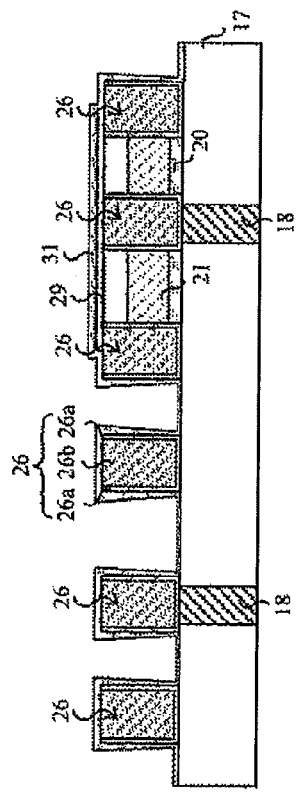
FIG. 11B is a cross-sectional view of principal parts in the manufacturing process of a semiconductor device continued from FIG. 10B.

In the space between nearest wirings, as the deposition of the insulating film 31 proceeds, the reactive species is obstructed by a deposited matter near an upper portion of the side surfaces of the facing wirings (facing surfaces of wirings), and gradually becomes difficult to enter a lower portion thereof. For this reason, the deposition rate near the lower portion of the side surfaces of the facing wirings is lower than the deposition rate near the upper portion thereof. Therefore, the thickness of the insulating film 31 deposited on the side surfaces of the facing wirings is not uniform, and the thickness near the upper portion is larger than the thickness near the lower portion. This phenomenon is more conspicuous in a space between nearest wirings among the second layer wirings 26. Therefore, it is most effective for the capacitance reduction to prevent the insulating film 31 from being formed on the bottom of the space between nearest wirings. However, it is still effective for the capacitance reduction to form the insulating film 31 so that coverage on the space between nearest wirings is equal to or lower than approximately 80% with respect to the thickness of the insulating film 31 on the second layer wirings 26 as depicted in FIGS. 11A and 11B.

The insulating film 31 is made of, for example, a silicon nitride film, and it functions as a barrier insulating film for copper wirings. Therefore, the insulating film 31 suppresses or prevents copper in the main conductive film 26b of each of the second layer wirings 26 from being diffused into the interlayer insulating film 36 formed later. As another material for the insulating film 31, a single-element film of any one of a silicon carbide (SiC) film, a silicon carbonitride (SiCN) film, and a silicon oxynitride (SiON) film may be used. When any of these films is used, the dielectric constant can be significantly reduced compared with a silicon nitride film, and therefore, the wiring capacitance can be reduced and the operation speed of the semiconductor device can be improved. An example of the silicon carbide film formed by plasma CVD is BLOk (manufactured by AMAT), and its film formation gas is as described above. For the formation of the SiCN film, for example, mixed gas of helium (He), ammonium ($NH_3$) and trimethylsilane (3MS) is used. Also, an example of the silicon oxynitride film formed by plasma CVD is PE-TMS (manufactured by Canon, relative permittivity=3.9). For the formation of the silicon oxynitride film, for example, mixed gas of trimethoxysilane (TMS) gas and nitrogen oxide ($N_2O$) gas is used.

As depicted in FIGS. 10 and 11, in the wiring structure fabricated as described above, the barrier insulating film in a region where through holes are fabricated has a thickness relatively larger than that of an upper portion of the wirings where no through hole is formed. Since the barrier insulating film on a lower portion of the through holes serves also as an etching stopper layer at the time of processing the through holes, its thickness has to be at least approximately 40 nm to 50 nm. Therefore, for example, if the barrier insulating films 29 and 31 each having a thickness of 25 nm are formed, the barrier insulating film in the reservoir region where a through hole may be present has a thickness of 50 nm, and in other regions around the wirings, the thickness is only 25 nm, which is the thickness of the barrier insulating film 31. In this manner, it is possible to efficiently reduce the capacitance and ensure a margin in the processing of the through holes.

Next, a reservoir formation method different from that described above with reference to FIGS. 8 to 11 will be described with reference to FIGS. 12 to 18.

Figure 12:
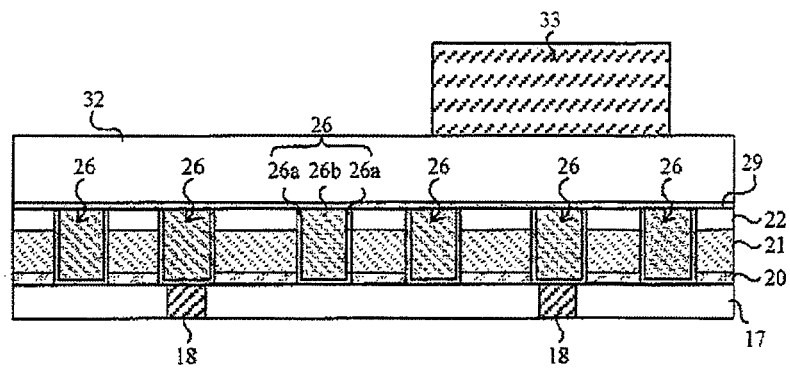
FIG. 12 is a cross-sectional view of principal parts in the manufacturing process of a semiconductor device according to another embodiment of the present invention continued from FIG. 7.

FIG. 12 is a cross-sectional view of principal parts in the manufacturing process of a semiconductor device according to another embodiment of the present invention continued from FIG. 7. In the through-hole reservoir formation method described above with reference to FIGS. 8 to 11, due to the etching using the photo-resist pattern 30, a Cu residual film may occur around the barrier insulating film 29 and the second layer wiring 26 depending on the dry-etching apparatus. To get around this, a method of forming a reservoir regardless of the dry-etching apparatus and the ashing apparatus will be described with reference to FIGS. 12 to 16. First, as depicted in FIG. 12, an insulating film 32 such as a silicon oxide film or an SiOC film is formed on the barrier insulating film 29 so as to have a thickness of 100 nm to 400 nm. Thereafter, photo-resist films are sequentially formed on the insulating film 32 and then patterned by exposure to form a photo-resist pattern 33. At the time of the formation of such a reservoir layer, in order to further increase the accuracy, a reflection preventive film can be used on a lower portion of the photo-resist films and an upper portion of the insulating film 32.

Figure 13:
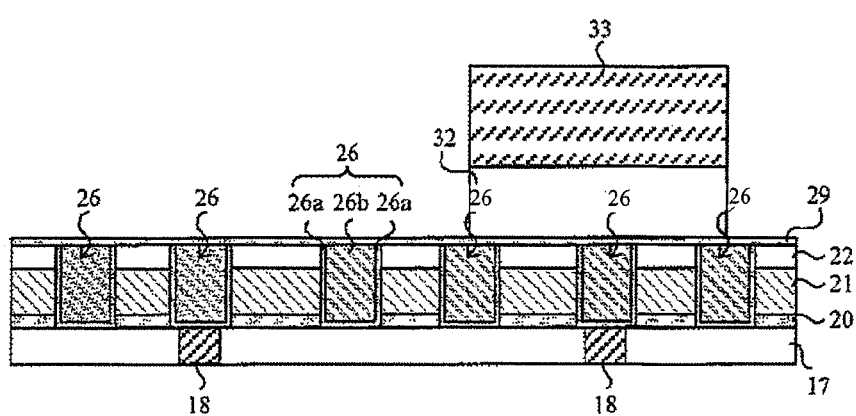
FIG. 13 is a cross-sectional view of principal parts in the manufacturing process of a semiconductor device continued from FIG. 12.
Figure 14:
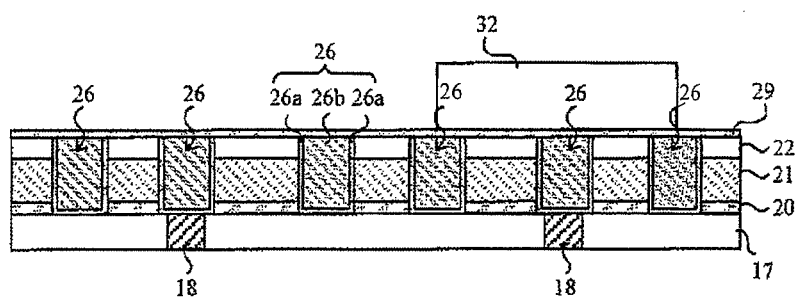
FIG. 14 is a cross-sectional view of principal parts in the manufacturing process of a semiconductor device continued from FIG. 13.
Figure 15A:
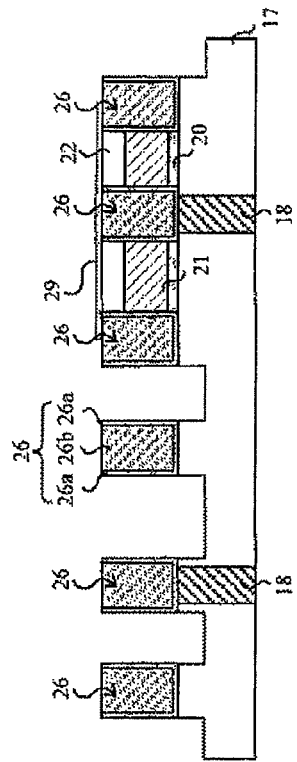
FIG. 15A is a cross-sectional view of principal parts in the manufacturing process of a semiconductor device continued from FIG. 14.
Figure 15B:
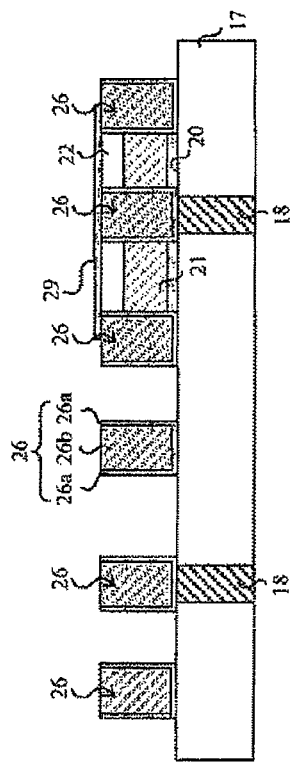
FIG. 15B is a cross-sectional view of principal parts in the manufacturing process of a semiconductor device continued from FIG. 14.

Next, as depicted in FIG. 13, the insulating film 32 is etched with using the photo-resist pattern 33 as a mask, and etching is stopped once on the barrier insulating film 29. Here, ashing is performed as depicted in FIG. 14 to remove the photo-resist pattern 33. By this means, the formation of a Cu residual film re-sputtered on the resist side wall can be prevented. Thereafter, as depicted in FIGS. 15A and 15B, the insulating films 29, 22, 21 and 20 are etched with using the insulating film 32 as a mask. Then, after post-cleaning and a hydrogen annealing process are performed, the barrier insulating film 31 with a thickness of 20 nm to 50 nm is formed so as to cover the upper surface and side surface of the second layer wirings 26, the barrier insulating film 29 for use in the formation of a reservoir, and the insulating film 17. Through the process as described above, the wiring structure equivalent to that of FIGS. 10A and 10B can be achieved as depicted in FIGS. 16A and 16B. Also, the wiring structure similar to that in FIGS. 11A and 11B can be obtained by using the formation method described above.

Figure 17A:
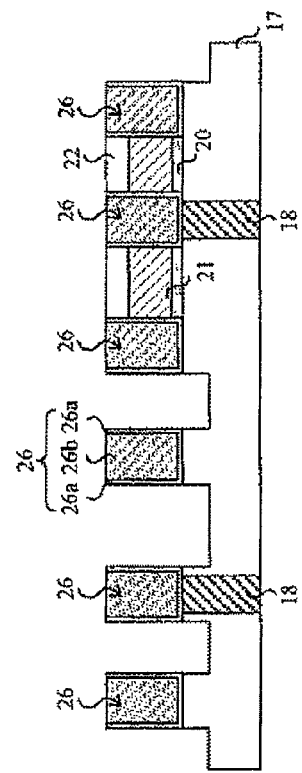
FIG. 17A is a cross-sectional view of principal parts in the manufacturing process of a semiconductor device according to another embodiment of the present invention continued from FIG. 14.
Figure 17B:
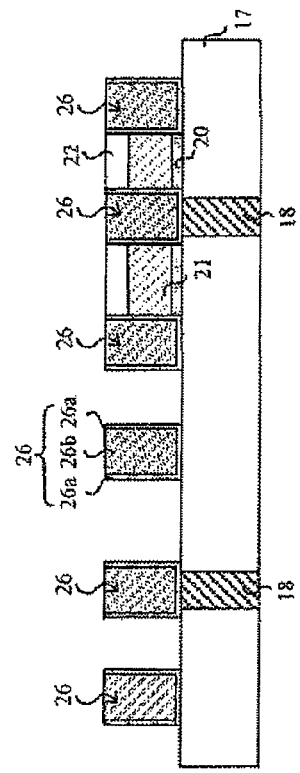
FIG. 17B is a cross-sectional view of principal parts in the manufacturing process of a semiconductor device according to another embodiment of the present invention continued from FIG. 14.
Figure 18A:
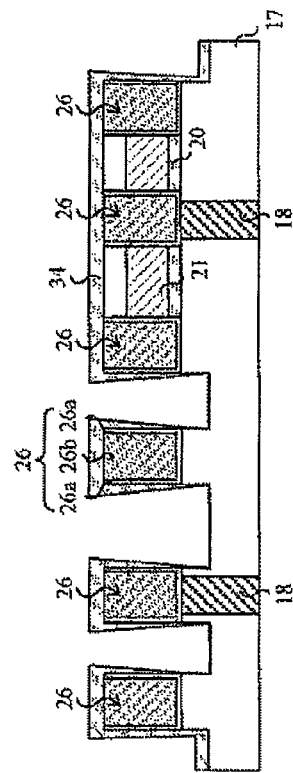
FIG. 18A is a cross-sectional view of principal parts in the manufacturing process of a semiconductor device continued from FIG. 17A.
Figure 18B:
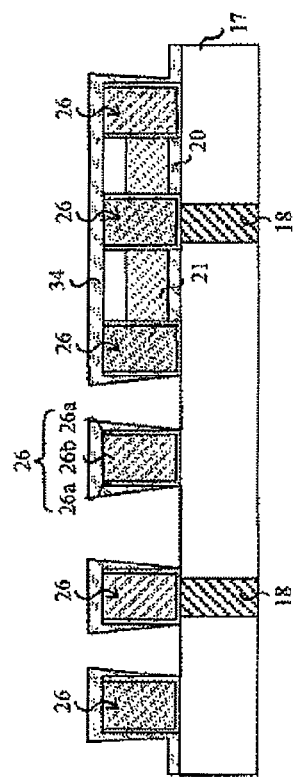
FIG. 18B is a cross-sectional view of principal parts in the manufacturing process of a semiconductor device continued from FIG. 17B.

FIGS. 17A and 17B are cross-sectional views of principal parts in the manufacturing process of a semiconductor device according to still another embodiment of the present invention. In this still another embodiment, when the patterned insulating film 32 is used to etch the insulating films 22, 21 and 20, if a selectivity between the insulating film 32 and the barrier insulating film 29 is low, after the barrier insulating film 29 is completely removed, a new barrier insulating film 34 is formed on the insulating film 22, the second layer wirings 26 and the insulating film 17 as depicted in FIGS. 18A and 18B. The barrier insulating film 34 is made of, for example, a silicon nitride film, and it functions as a barrier insulating film for copper wirings. Therefore, the barrier insulating film 34 suppresses or prevents copper in the main conductive film 26b of each of the second layer wirings 26 from being diffused into the interlayer insulating film 36 formed later. As another material for the barrier insulating film 34, a single-element film of any one of a silicon carbide (SiC) film, a silicon carbonitride (SiCN) film, and a silicon oxynitride (SiON) film may be used. When any of these films is used, the dielectric constant can be significantly reduced compared with a silicon nitride film, and therefore, the wiring capacitance can be reduced and the operation speed of the semiconductor device can be improved. An example of the silicon carbide film formed by plasma CVD is BLOk (manufactured by AMAT), and its film formation gas is as described above. For the formation of the SiCN film, for example, mixed gas of helium (He), ammonium ($NH_3$) and trimethylsilane (3MS) is used. Also, an example of the silicon oxynitride film formed by plasma CVD is PE-TMS (manufactured by Canon, relative permittivity=3.9). For the formation of the silicon oxynitride film, for example, mixed gas of trimethoxysilane (TMS) gas and nitrogen oxide ($N_2O$) gas is used.

Figure 19:
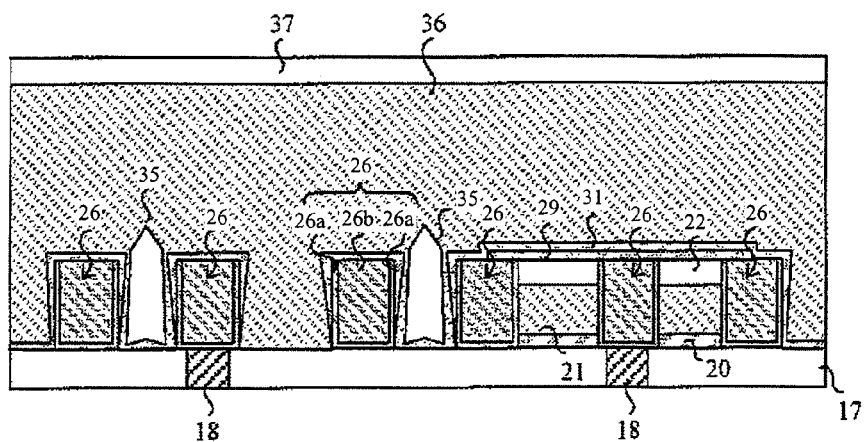
FIG. 19 is a cross-sectional view of principal parts in the manufacturing process of a semiconductor device continued from FIGS. 11 and 16.

FIG. 19 is a cross-sectional view of principal parts in the manufacturing process of a semiconductor device according to the embodiment of the present invention continued from FIGS. 10A and 10B or FIGS. 16A and 16B. Insulating films 36 and 37 are formed on the barrier insulating film 31. A Low-K insulating film such as SiOF or SiOC is used for the insulating film 36, and a silicon oxide film or the like is used for the insulating film 37 as a cap of the Low-K insulating film. Alternatively, for the simplification of the process, a single-element film of silicon oxide or SiOC can be used for the insulating film 36 by omitting the insulating film 37.

In the present embodiment, the insulating film 36 is formed under the condition that the insulating film 36 is not formed in a conformal manner in a space between nearest wirings (minimum space between adjacent wirings or minimum pitch between wirings). Here, the nearest wirings correspond to the adjacent wirings having the minimum space therebetween in the wirings of the same layer (distance between adjacent wirings). In the space between nearest wirings, the reduction in parasite capacitance is more important.

In the space between nearest wirings, as the deposition of the insulating film 36 proceeds, the reactive species is obstructed by a deposited matter near an upper portion of the side surfaces of the facing wirings (facing surfaces of wirings), and gradually becomes difficult to enter a lower portion thereof. For this reason, the deposition rate near the lower portion of the side surfaces of the facing wirings is lower than the deposition rate near the upper portion thereof. Therefore, the thickness of the insulating film 36 deposited on the side surfaces of the facing wirings is not uniform, and the thickness near the upper portion is larger than the thickness near the lower portion. This phenomenon is more conspicuous in a space between nearest wirings among the second layer wirings 26.

Therefore, in the space between nearest wirings of the second layer wirings 26, the insulating film 36 does not have a conformal shape reflecting the shape of the second layer wirings 26, and it has a gap (air gap) 35 as depicted in FIG. 19. Also, plasma CVD or the like can be used for the formation of the insulating film 36, and by adjusting conditions of forming the insulating film 36, the above-described gap (air gap) 35 can be easily formed in the space between nearest wirings. Furthermore, in the present embodiment, since the upper surface and side surface of the second layer wirings 26 are covered with the barrier insulating film 31, the second layer wirings 26 can be formed only by the main conductive film 26b made of copper by omitting the conductive barrier film 26a in the second layer wiring 26. After the insulating films 36 and 37 are formed, interlayer CMP is performed for the planarization in order to remove the difference in level between wirings.

Figure 20:
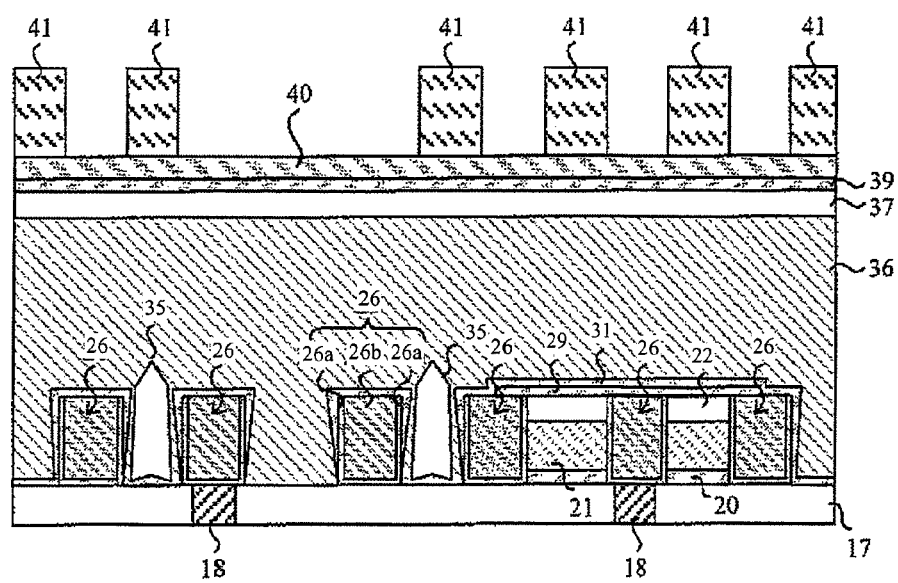
FIG. 20 is a cross-sectional view of principal parts in the manufacturing process of a semiconductor device continued from FIG. 19.
Figure 21:
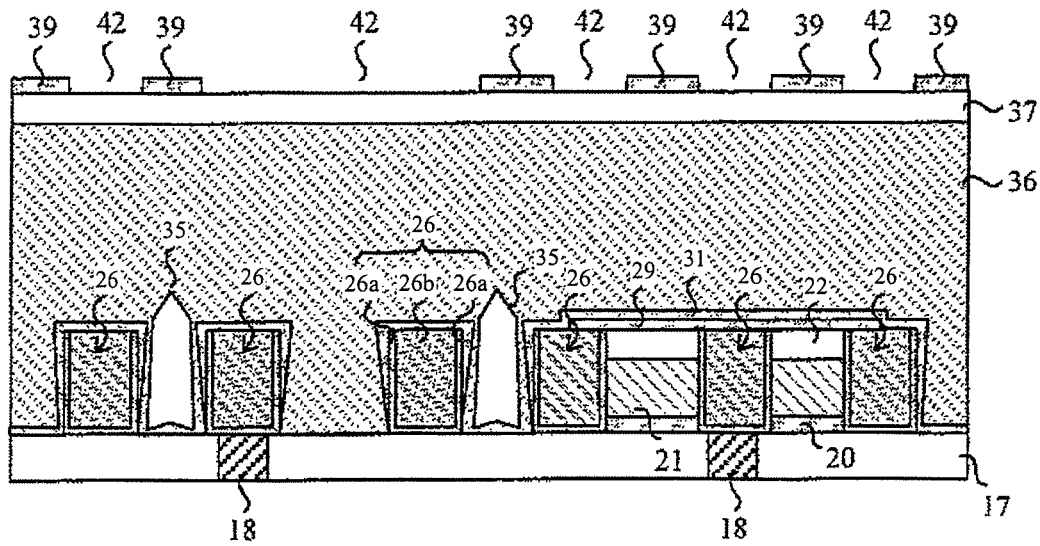
FIG. 21 is a cross-sectional view of principal parts in the manufacturing process of a semiconductor device continued from FIG. 20.

Next, after an insulating film 39 is formed as depicted in FIG. 20, a reflection preventive film 40 and a photo-resist film are sequentially formed on the insulating film 39, and the photo-resist film is patterned by exposure to form a photo-resist pattern 41. Then, by the dry-etching using the photo-resist pattern 41 as a mask, the reflection preventive film 40 and the insulating film 39 are selectively removed, and then ashing is performed to remove the reflection preventive film 40 and the photo-resist film. As a result, openings 42 to be wiring trenches later can be fabricated as depicted in FIG. 21.

Figure 22:
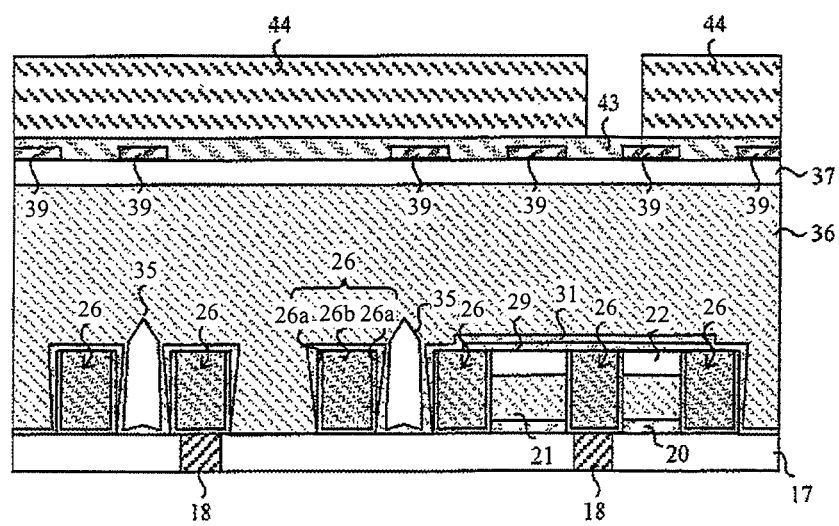
FIG. 22 is a cross-sectional view of principal parts in the manufacturing process of a semiconductor device continued from FIG. 21.
Figure 23:
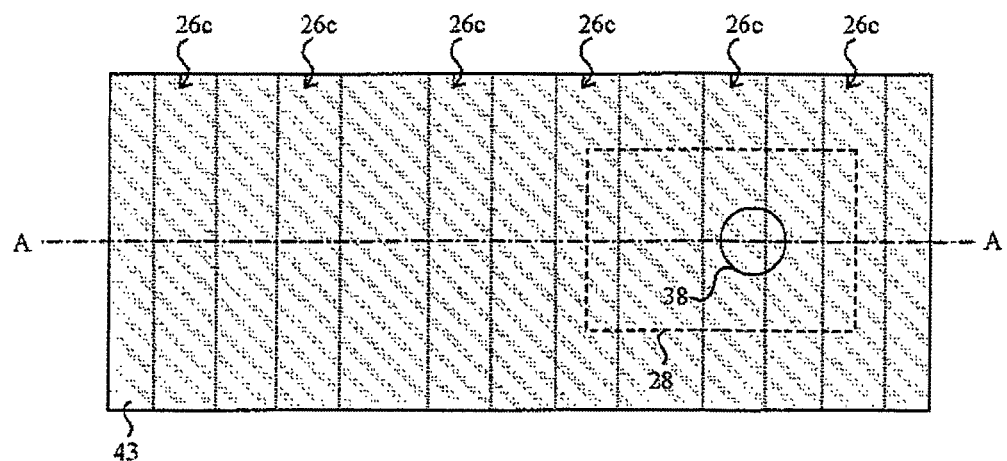
FIG. 23 is a plan view of principal parts in a region corresponding to FIG. 2 in the manufacturing process of a semiconductor device continued from FIG. 22.

Next, patterning for forming through holes is performed. As depicted in FIG. 22, a reflection preventive film 43 and a photo-resist film are sequentially formed on the insulating films 37 and 39, and the photo-resist film is patterned by exposure to form a photo-resist pattern 44. FIG. 23 is a plan view of principal parts in a region corresponding to FIG. 2 in the manufacturing process of a semiconductor device continued from FIG. 22. FIG. 23 depicts second layer wiring positions 26c, a misaligned through hole position 38 connected to the second layer wirings and third layer wirings, and a reservoir formation position 28 formed around the second layer wirings. Here, the position of the through hole 38 actually misaligned at the time of the exposure of a via pattern of FIG. 21 is depicted.

Figure 24:
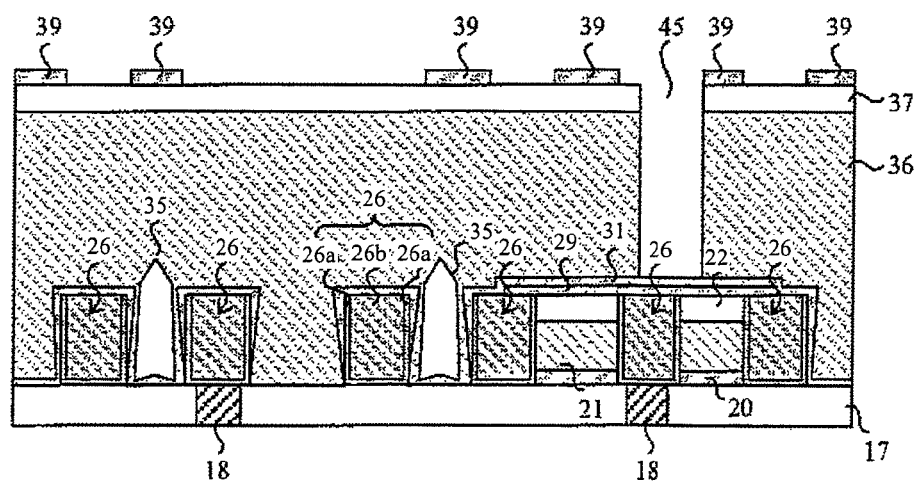
FIG. 24 is a cross-sectional view of an A-A line in FIG. 23 continued from FIG. 23.

FIG. 24 is a cross-sectional view of an A-A line in FIG. 23 continued from FIG. 23. By the dry-etching using the photo-resist pattern 44 as an etching mask, the reflection preventive film 43 and the insulating films 39, 37 and 36 are selectively removed, and ashing is performed to remove the reflection preventive film and the photo-resist films, thereby forming through-hole openings 45.

Figure 25:
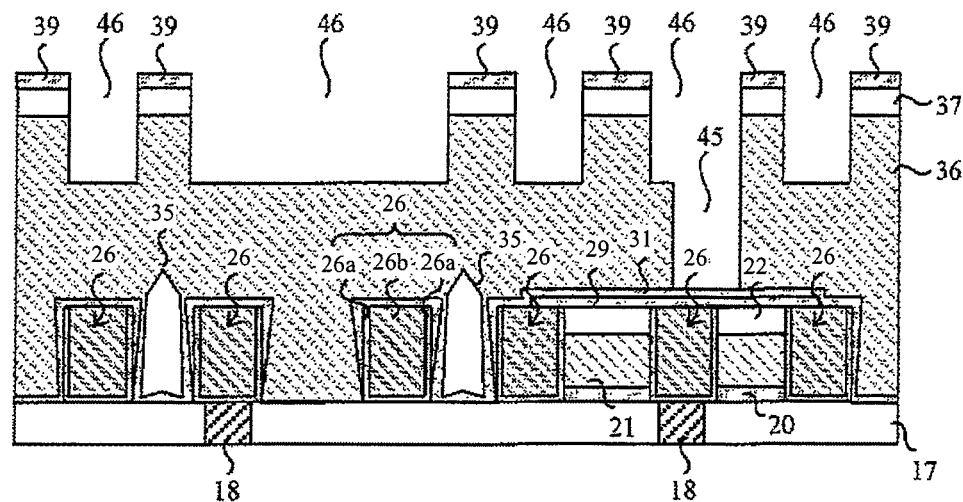
FIG. 25 is a cross-sectional view of principal parts in the manufacturing process of a semiconductor device continued from FIG. 24.
Figure 26:
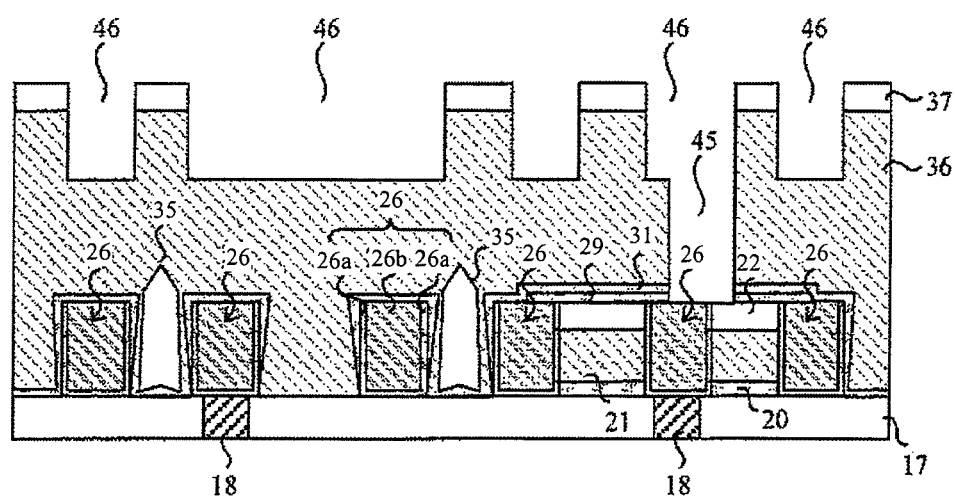
FIG. 26 is a cross-sectional view of principal parts in the manufacturing process of a semiconductor device continued from FIG. 25.

Next, as depicted in FIG. 25, trench process is performed with using the insulating film 39 as a mask to fabricate trench openings 46. Subsequently, as depicted in FIG. 26, the barrier insulating films 29 and 31 on the lower portion of the through holes are simultaneously removed together with the insulating film 39 used as a mask.

Next, a thin conductive barrier film (first conductive film) 47a made of, for example, titanium nitride (TiN) or the like and having a thickness of approximately 5 nm to 50 nm is formed by using sputtering over the entire main surface of the substrate 1. Other than titanium nitride, various materials as those described above for the conductive barrier film 26a can be applied to the conductive barrier film 47a. Subsequently, a relatively-thick main conductive film (second conductive film) 47b having a thickness of, for example, approximately 800 nm to 1600 nm and made of copper is formed on the conductive barrier film 47a. The main conductive film 47b can be formed by using, for example, CVD, sputtering, or plating. Thereafter, the substrate 1 is subjected to a heat treatment in a non-oxidation atmosphere (for example, hydrogen atmosphere or nitrogen atmosphere) at, for example, approximately 150 to 400° C. to reflow the main conductive film 47b, thereby tightly filling the wiring trenches 45 and 46 with copper.

Figure 27:
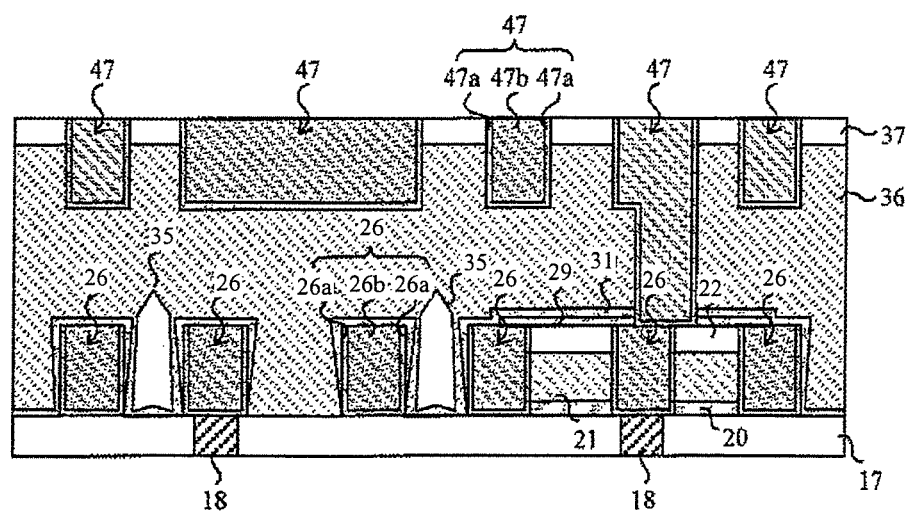
FIG. 27 is a cross-sectional view of principal parts in the manufacturing process of a semiconductor device continued from FIG. 26.

Next, the main conductive film 47b and the conductive barrier film 47a are polished by CMP. By this means, as depicted in FIG. 27, third layer wirings (wirings) 47 formed of the relatively-thin conductive barrier film 47a and the relatively-thick main conductive film 47b are formed in the wiring trenches 45 and 46. These third layer wirings 47 are electrically connected to the first layer wirings 15 and the second layer wirings 26 via the through holes 45.

Figure 28:
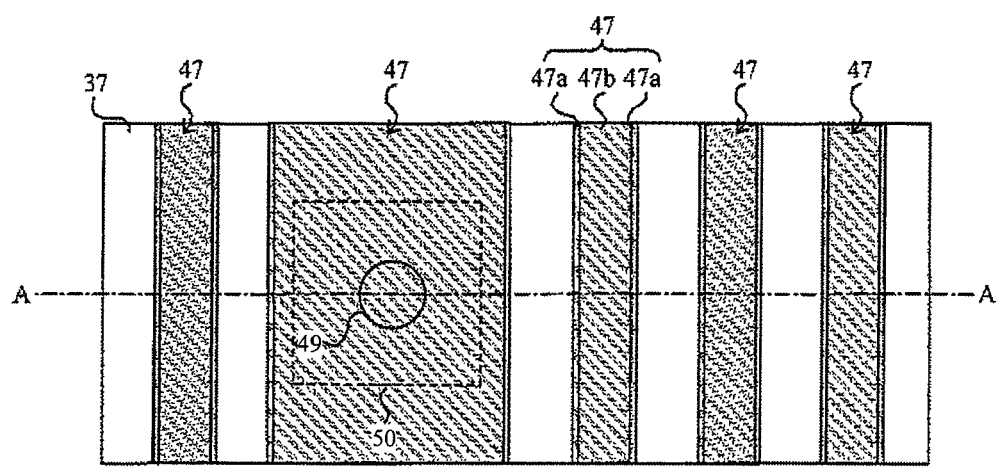
FIG. 28 is a plan view of principal parts in a region corresponding to FIG. 2 in the manufacturing process of a semiconductor device continued from FIG. 27.

FIG. 28 is a plan view of principal parts corresponding to FIG. 2 in the manufacturing process of a semiconductor device continued from FIG. 27. FIG. 28 depicts the third layer wirings 47 and a formation position 49 of a through hole connected to the second layer wiring and an upper layer. Similar to the description of FIG. 7, as the measures for the misaligned through hole (misalignment of the through hole), a reservoir formation position 50 is set so that a limited portion of the third layer wiring is in the same state as that of a normal interlayer structure.

Figure 29:
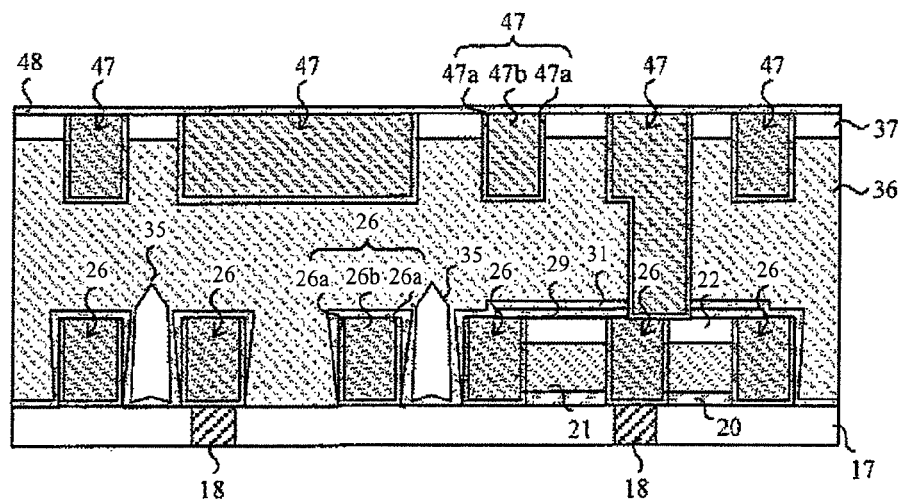
FIG. 29 is a cross-sectional view of an A-A line in FIG. 28 continued from FIG. 28.

FIG. 29 is a cross-sectional view of an A-A line in FIG. 28 continued from FIG. 28. Also in FIG. 29, the illustration of the portions corresponding to the structure below the insulating film 17 in FIG. 3 is omitted. A barrier insulating film 48 having a thickness of 20 nm to 50 nm is formed on the insulating film 37 and the third layer wirings 47. The barrier insulating film 48 is made of, for example, a silicon nitride film, and it functions as a barrier insulating film for copper wirings. Therefore, the barrier insulating film 48 suppresses or prevents copper in the main conductive film 47b of the third layer wirings 47 from being diffused into an interlayer insulating film 53 formed later. As another material for the barrier insulating film 48, for example, a single-element film of any one of a silicon carbide (SiC) film, a silicon carbonitride (SiCN) film and a silicon oxynitride (SiON) film may be used. When any of these films is used, the dielectric constant can be significantly reduced compared with a silicon nitride film, and therefore, wiring capacitance can be reduced, and the operation speed of the semiconductor device can be improved. A fabrication method thereof is identical to that described for the insulating film 29 with reference to FIG. 8 and is therefore omitted.

Figure 30:
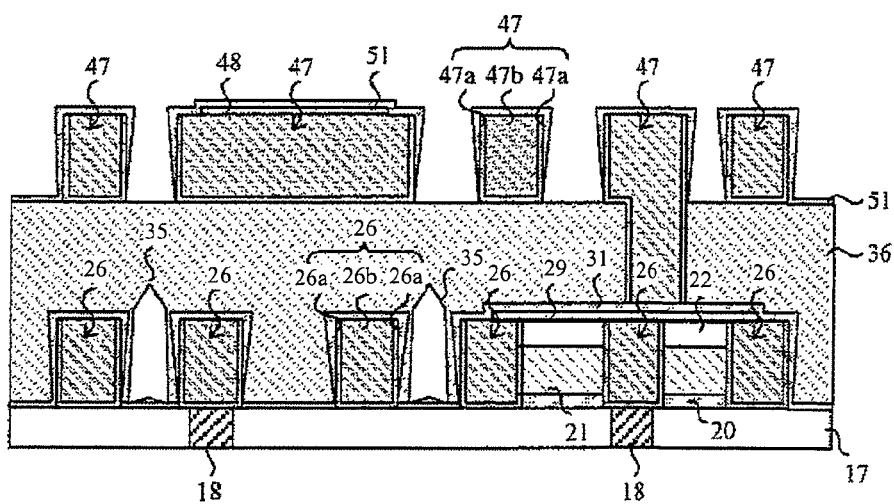
FIG. 30 is a cross-sectional view of principal parts in the manufacturing process of a semiconductor device continued from FIG. 29.

Next, in the same manner as that described with reference to FIGS. 7 to 11, a reservoir 50 is formed around the third layer wiring 47. As depicted in FIG. 30, after the barrier insulating film 48 and the insulating films 37 and 36 are etched with using a resist mask pattern, a new barrier insulating film 51 with a thickness of 20 nm to 50 nm is formed on upper portions and side surfaces of the insulating films 36 and 37, the barrier insulating film 48 and the third layer wirings 47. The barrier insulating film 51 is made of, for example, a silicon nitride film, and it functions as a barrier insulating film for copper wirings. Therefore, the barrier insulating film 51 suppresses or prevents copper in the main conductive film 47b of the third layer wirings 47 from being diffused into the interlayer insulating film 53 formed later. As another material for the barrier insulating film 51, for example, a single-element film of any one of a silicon carbide (SiC) film, a silicon carbonitride (SiCN) film and a silicon oxynitride (SiON) film may be used. When any of these films is used, the dielectric constant can be significantly reduced compared with a silicon nitride film, and therefore, wiring capacitance can be reduced, and the operation speed of the semiconductor device can be improved. A fabrication method is identical to that described for the insulating film 29 with reference to FIG. 8 and is therefore omitted.

Figure 31:
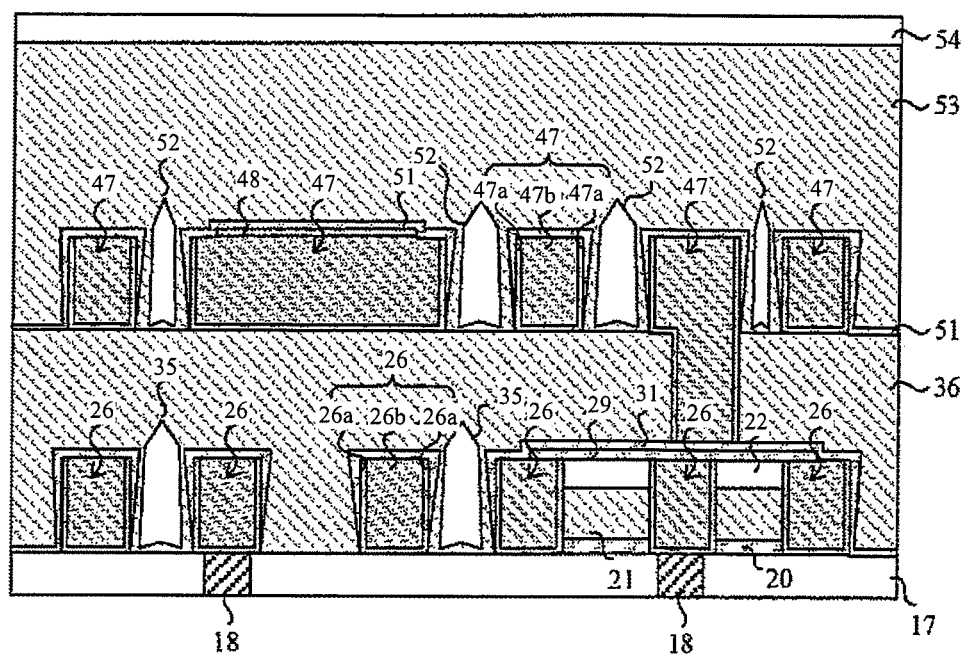
FIG. 31 is a cross-sectional view of principal parts in the manufacturing process of a semiconductor device continued from FIG. 30.

Next, as depicted in FIG. 31, insulating films 53 and 54 are formed and are then planarized by CMP. When upper layers are continuously formed, upper-layer wirings of fourth and further layer wirings can be formed by repeating the method depicted in FIGS. 20 to 31. Also, the first layer wirings 15 can be copper wirings formed in the same manner as that of the second layer wirings 26, and the second layer wirings 26 can be copper wirings formed in the same manner as that of the third layer wirings 47.

According to the present embodiment, no CMP surface (surface polished by CMP) is present between the wirings of the same layer. More specifically, most of the insulating films 21 and 22 and the insulating films 36 and 37 polished in the CMP process for forming the second layer wirings 26 and the third layer wirings 47 are removed, and the barrier insulating films 31 and 51 are formed so as to cover the second layer wirings 26 and the third layer wirings 47. Therefore, in the second layer wirings 26 and the third layer wirings 47, other than the limited reservoir region, the upper surfaces of the wirings of the same layer are not connected to each other via the CMP surface. Accordingly, the dielectric withstand voltage between wirings can be improved, and TDDB life can also be increased. In other words, reliability of the semiconductor device can be enhanced.

Also, gaps (air gaps) 35 and 52 are formed in spaces between nearest wirings in the wirings of the same layer where the capacitance reduction is needed most, and the barrier insulating film on the space between nearest wirings, that is, on the bottom of the gap is thinner than the barrier insulating film on the wirings. Therefore, the inter-wiring capacitance can be efficiently reduced. Even when a material with a relatively high dielectric constant is used for the barrier insulating films 31 and 51 on the wirings, the inter-wiring capacitance can be reduced. Also, in a region where a distance between adjacent wirings of the same layer is long, a Low-K material is formed without forming an air gap between wirings. Therefore, the entire mechanical strength can be maintained.

In the present embodiment, insulating-film regions of the reservoirs 28 and 50 are formed around a through hole and a portion connected to its lower layer wirings. However, since the ratio thereof is small with respect to the region of the nearest wiring patterns, a capacitance reduction effect by the air gaps can be sufficiently achieved.

Furthermore, in the present embodiment, the air gap 35 or may be formed not only in a space between the nearest wirings but also between adjacent wirings having a relatively short distance therebetween and whose parasite capacitance therebetween is desired to be reduced. Conditions of an inter-wiring distance for forming an air gap can be controlled by adjusting film-formation conditions of the barrier insulating films 31 and 51 and film-formation conditions of the insulating films 36 and 52. By this means, the inter-wiring capacitance can be reduced by forming air gaps between adjacent wirings in a region where the wiring pattern density is high, and mechanical strength can be maintained by filling the spaces between wirings with a Low-K material in a region where the wiring pattern density is low.

The inventor studied a capacitance reduction effect of the wiring structure of the present embodiment through experiments and simulations. As a comparison example, a Low-K material was used for an insulating film and an interlayer insulating film for filling the spaces between wirings, and a copper wiring structure formed by a normal Damascene technique was used.

As a result, the wiring structure of the present embodiment was able to reduce the inter-wiring capacitance by approximately 30% to 45% with respect to the comparison example (conventional Damascene structure) and by approximately 10% to 15% with respect to the example of the conventional air-gap wiring (Patent Document 1) without increasing the number of processes. Also, the capacitance between an upper layer wiring and a lower layer wiring was hardly changed, and only the inter-wiring capacitance of the same layer was decreased. Therefore, an influence of wiring crosstalk can be reduced. Furthermore, an effective dielectric constant ∈r (in the copper wiring structure of the comparison example above, ∈r is approximately 3.1) was able to be significantly reduced to approximately 2.3 to 2.7. Therefore, a low-capacitance wiring structure of the next and subsequent generations can be achieved with using the Low-K material of the same generation for the interlayer insulating film.

(Second Embodiment)

Figure 32:
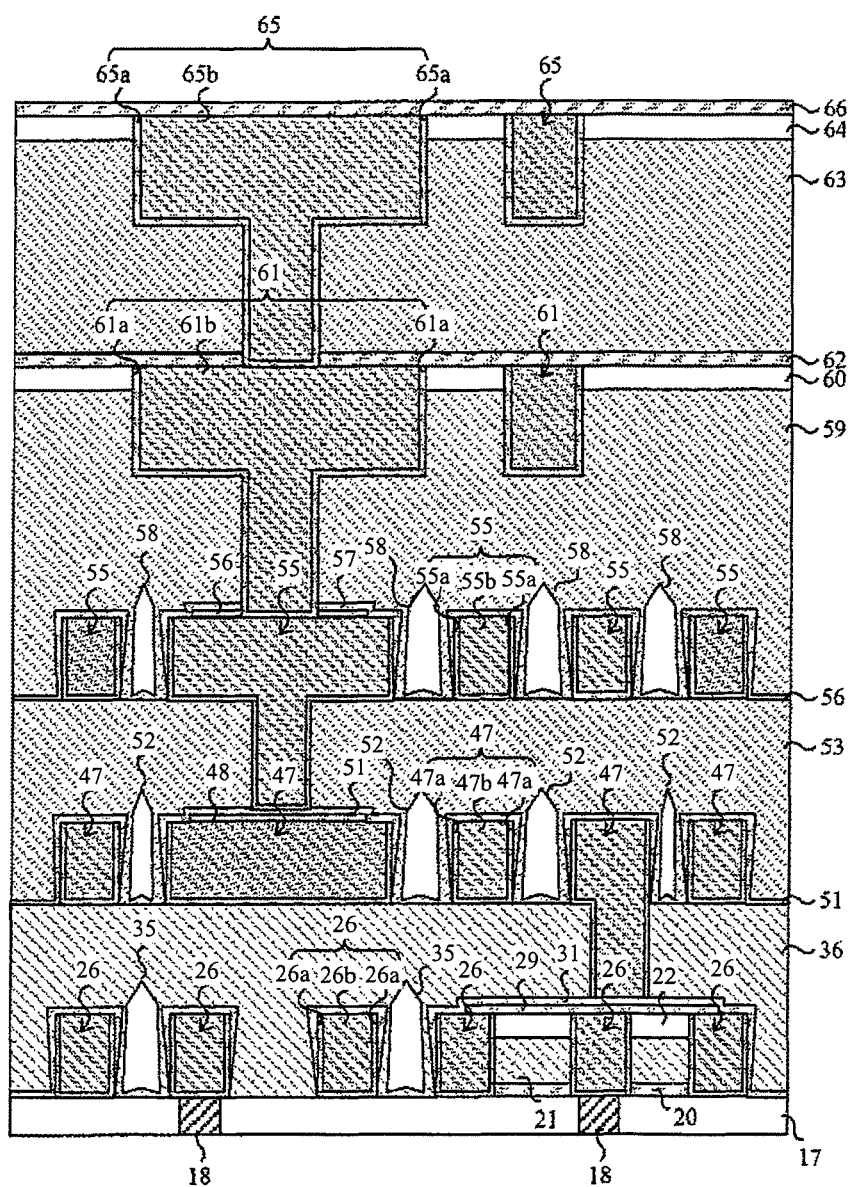
FIG. 32 is a cross-sectional view of principal parts in the manufacturing process of a semiconductor device according to another embodiment of the present invention.

FIG. 32 is a cross-sectional view of principal parts in the manufacturing process of a semiconductor device according to a second embodiment of the present invention. The semiconductor device of the present embodiment has a multilayer wiring structure where the structure having a wiring layer and a reservoir in which air gaps are formed between adjacent wirings and these adjacent wirings are not connected via a CMP surface like the second layer wirings 26 and the third layer wirings 47 of the first embodiment and a wiring layer formed by using a general buried wiring technique are combined. In FIG. 31, up to the process of forming an insulating film 60 on an upper portion of fourth layer wirings 55, the manufacturing process is almost similar to those described with reference to FIGS. 4 to 10 and FIGS. 18 to 30 of the first embodiment, and therefore, the description thereof is omitted and the subsequent manufacturing process will be described here.

Fifth and subsequent wiring layers are formed by using a general buried wiring technique, for example, a general Dual Damascene technique. First, after an insulating film 60 is planarized by CMP, fifth layer wirings are formed. That is, by using a Dual Damascene technique, fifth layer wirings 61 buried in wiring trenches formed in the insulating films 60, 59, 57 and 56 are formed. Then, on the insulating film 60 including upper surfaces of the fifth layer wirings 61, an insulating film 62 made of a silicon nitride film, a silicon carbide film, a silicon carbonitride film or a silicon oxynitride film is formed as a barrier insulating film. Thereafter, insulating films 63 and 64 made of a Low-K material or the like are formed on the insulating film 62. Similarly, by using a Dual Damascene technique, sixth layer wirings 65 buried in wiring trenches formed in the insulating films 62 to 64 are formed. Then, an insulating film 66 made of the same material as that of the insulating film 62, for example, silicon nitride is formed as a barrier insulating film on the insulating film 64 including upper surfaces of the sixth layer wirings 65.

Note that a film formed by using CVD, for example, a silicon oxide film, an FSG (SiOF-based material) film, an SiOC film or a porous silicon (Polus-Si) material film can be used as each of the insulating films 36, 53, 59 and 63.

In the multilayer wiring structure, in a wiring layer with a relatively-small space between adjacent wirings, that is, a relatively-small wiring pitch, the inter-wiring capacitance tends to be increased and TDDB life tends to be decreased. According to the present embodiment, in such a wiring layer where the inter-wiring capacitance tends to be increased and TDDB life tends to be decreased, no CMP surface is provided between wirings of the same layer other than the limited reservoir region, thereby increasing the TDDB life. Also, while keeping even a misaligned via contact in a proper state by using the reservoir structure, the inter-wiring capacitance can be reduced by forming an air gap in a space between nearest wirings in the wirings of the same layer.

(Third Embodiment)

FIG. 33 is a cross-sectional view of principal parts in the manufacturing process of a semiconductor device according to a third embodiment of the present invention continued from FIG. 3. Also in FIG. 33, the illustration of portions corresponding to the structure below the insulating film 17 in FIG. 3 is omitted.

The present embodiment discloses air-gap wirings whose capacitance variations are more reduced than those of the air-gap wirings described in the first embodiment by using a via interlayer insulating film made of a material different from a wiring interlayer insulating film as an etching stopper.

FIGS. 33 to 35 are cross-sectional views of principal parts in the manufacturing process of a semiconductor device continued from FIG. 2.

Figure 33A:
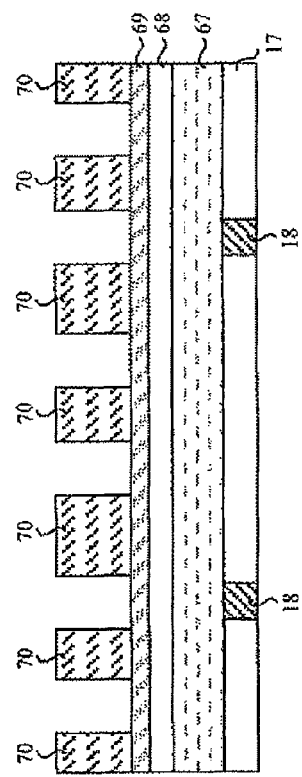
FIG. 33A is a cross-sectional view of principal parts in the manufacturing process of a semiconductor device according to another embodiment of the present invention continued from FIG. 3.
Figure 33B:
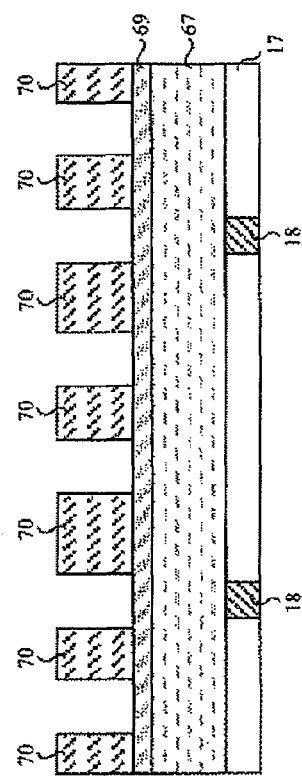
FIG. 33B is a cross-sectional view of principal parts in the manufacturing process of a semiconductor device according to another embodiment of the present invention continued from FIG. 3.

First, in the present embodiment, as depicted in FIG. 33A, an insulating film 67 is formed on the insulating film 17 having the through holes 18 embedded therein. For the insulating film 67, a Low-K material or an insulating film, for example, an organic film such as a SiLK film is used. Also, as depicted in FIG. 33B, in view of mechanical protection against CMP, for example, a silicon oxide film or an SiOC film may be used as an insulating film 68 formed as a cap on the insulating film 67.

Figure 34A:
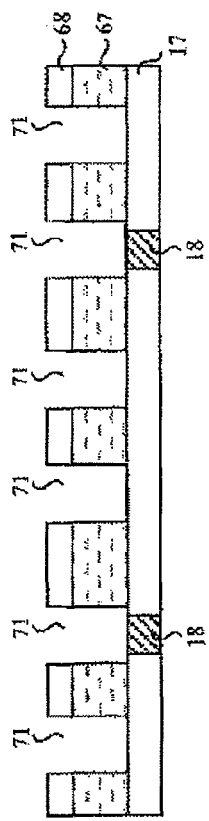
FIG. 34A is a cross-sectional view of principal parts in the manufacturing process of a semiconductor device continued from FIG. 33A.
Figure 34B:
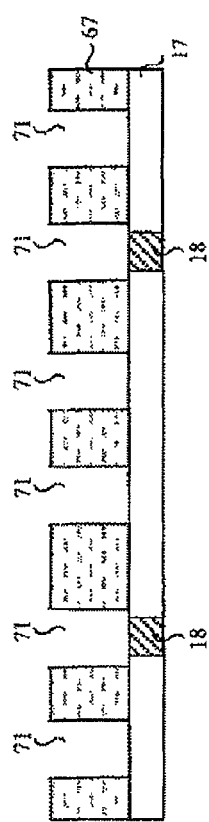
FIG. 34B is a cross-sectional view of principal parts in the manufacturing process of a semiconductor device continued from FIG. 33B.

Next, a reflection preventive film 69 and a photo-resist film are sequentially formed on the insulating film 67 or the insulating film 68, and then, the photo-resist film is patterned by exposure to form a photo-resist pattern 70. Then, by the dry-etching using the photo-resist pattern 70 as an etching mask, the reflection preventive film 69 is selectively removed. Thereafter, by the dry-etching using the photo-resist pattern 70 as an etching mask, the insulating films 68 and 67 are selectively removed to form openings. Then, the photo-resist pattern 70 and the reflection preventive film 69 are subjected to ashing and removed. In this manner, as depicted in FIGS. 34A and 34B, openings or wiring trenches 71 are formed. From the bottom surfaces of the wiring trenches 71, the upper surfaces of the plugs 18 are exposed.

Figure 35A:
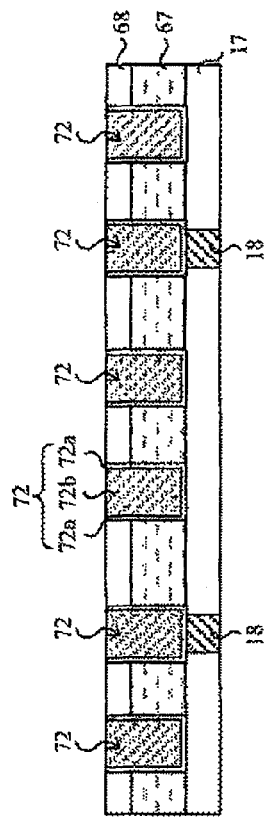
FIG. 35A is a cross-sectional view of principal parts in the manufacturing process of a semiconductor device continued from FIG. 34A.
Figure 35B:
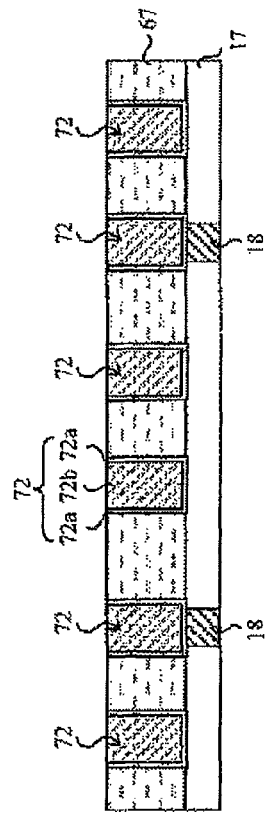
FIG. 35B is a cross-sectional view of principal parts in the manufacturing process of a semiconductor device continued from FIG. 34B.

Next, as depicted in FIGS. 35A and 35B, a thin conductive barrier film (first conductive film) 72a made of titanium nitride (TiN) or the like and having a thickness of approximately 5 nm to 50 nm is formed over the entire main surface of the substrate 1 by using sputtering. The conductive barrier film 72a has functions of, for example, preventing the diffusion of copper for forming a main conductive film described further below and improving wettability of copper at the time of reflow of the main conductive film. As a material for the conductive barrier film 72a, a high-melting metal nitride such as tungsten nitride (WN) or tantalum nitride (TaN) which hardly reacts with copper can be used in place of titanium nitride. Also, as a material for the conductive barrier film 72a, a material obtained by adding silicon (Si) to a high-melting metal nitride, a high-melting metal unlikely to react with copper such as tantalum (Ta), titanium (Ti), tungsten (W) or titanium tungsten (TiW) alloy, and a TaN/Ta stacked barrier obtained by combining TaN with high adhesion to an insulating film and Ta with high Cu wettability can be used.

Subsequently, a relatively-thick main conductive film (second conductive film) 72b having a thickness of, for example, approximately 800 nm to 1600 nm and made of copper is formed on the conductive barrier film 72a. The main conductive film 72b can be formed by using, for example, CVD, sputtering, or plating. Thereafter, the substrate 1 is subjected to a heat treatment in a non-oxidation atmosphere (for example, hydrogen atmosphere or nitrogen atmosphere) at, for example, approximately 150 to 400° C. to reflow the main conductive film 72b, thereby tightly filling the wiring trenches 72 with copper.

Next, the main conductive film 72b and the conductive barrier film 72a are polished by CMP. By this means, as depicted in FIG. 35, second layer wirings (wirings) 72 formed of the relatively-thin conductive barrier film 72a and the relatively-thick main conductive film 72b are formed in the wiring trenches 71. These second layer wirings 72 are electrically connected to the first layer wirings 15 via the plugs 18.

Figure 36:
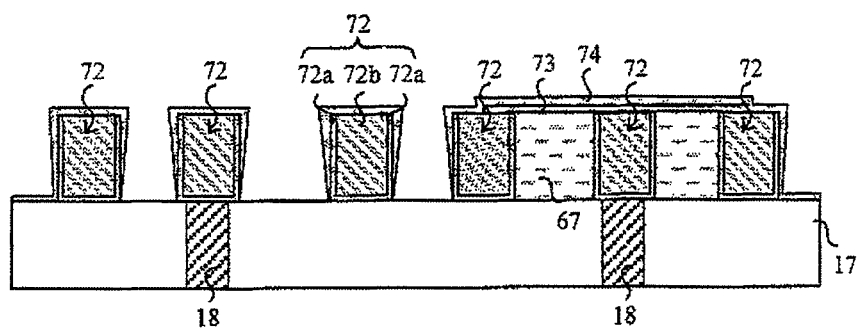
FIG. 36 is a cross-sectional view of principal parts in the manufacturing process of a semiconductor device continued from FIG. 35.

FIG. 36 depicts a wiring structure formed in the same manner as that described with reference to FIGS. 7 to 11. The insulating film 67 is left at the reservoir position, and the insulating film 67 other than that position is removed. At this time, for the removal of an organic film, reducing etching gas is used. Therefore, the plasma CVD film 17 serves as an etching stopper, and the depth for removal becomes uniform compared with the case of time-controlled etching. Accordingly, the shape of the gaps to be formed later becomes uniform, and capacitance variations can be reduced more compared with the air-gap wirings disclosed in Patent Documents 1 and 2. As described in the first embodiment, capacitance can be reduced by forming the barrier insulating film 74 so as to have a smaller thickness at a portion between the nearest wirings than that on the wiring 72.

Figure 37A:
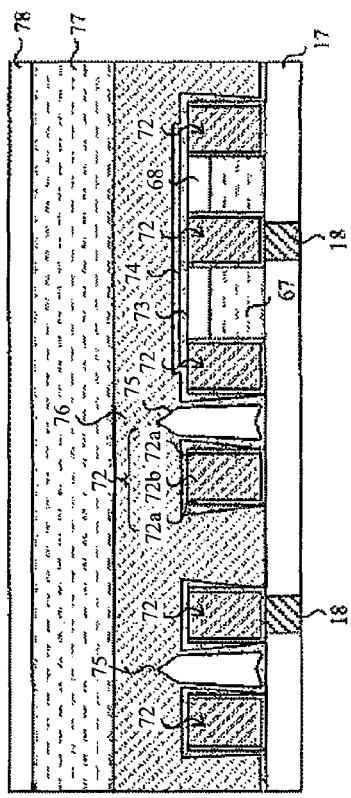
FIG. 37A is a cross-sectional view of principal parts in the manufacturing process of a semiconductor device continued from FIG. 36.
Figure 37B:
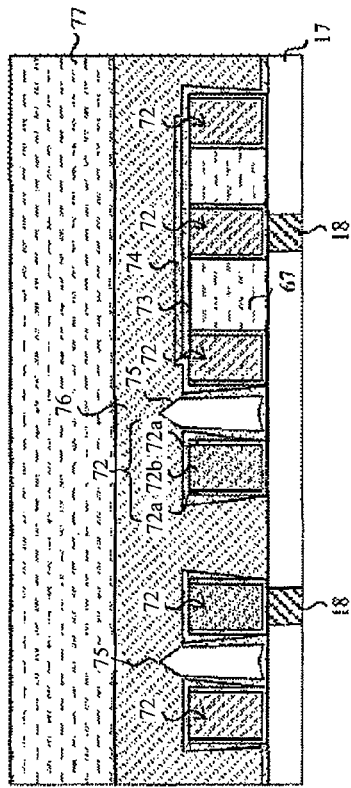
FIG. 37B is a cross-sectional view of principal parts in the manufacturing process of a semiconductor device continued from FIG. 36.

Next, as depicted in FIGS. 37A and 37B, an insulating film 76 is formed on the barrier insulating film 74 by using plasma CVD in the same manner as that depicted in FIG. 19 to form gaps 75. Then, after planarizing the insulating film 76, an insulating film 77 is formed. At this time, similar to the formation described with reference to FIGS. 35 and 36, the insulating film 76 is assumed to be a plasma CVD film such as SiO2, SiOF or SiOC, and the insulating film 77 is assumed to be an organic film. By stacking the films in this manner, the insulating film 76 serves as an etch stopper when the insulating film 77 is removed, and a uniform gap height can be obtained and capacitance variations can be reduced.

The film thickness of the insulating film 76 is set to a position deeper than the wiring bottom of the third layer wirings 79 formed later. By this means, capacitance variations can be reduced, and at the same time, capacitance itself can be further reduced.

Also, as depicted in FIG. 37B, an insulating film 78 may be used as a CMP protective film for use in the formation of the third layer wirings 79 described further below.

Next, the third layer wirings 79 are formed by using a Dual Damascene technique in the same manner as the formation method depicted in FIGS. 20 to 27.

Figure 38A:
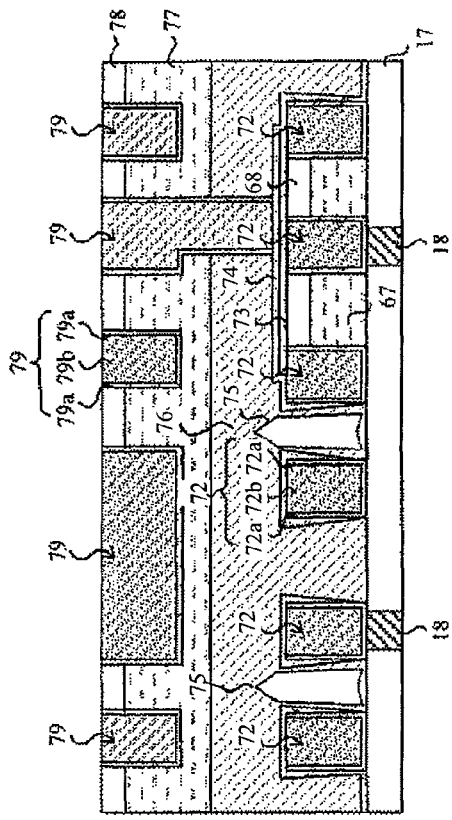
FIG. 38A is a cross-sectional view of principal parts in the manufacturing process of a semiconductor device continued from FIG. 37A.
Figure 38B:
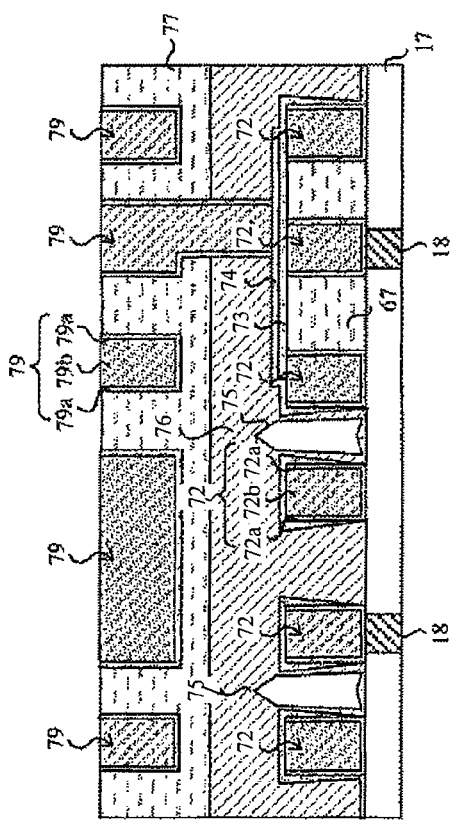
FIG. 38B is a cross-sectional view of principal parts in the manufacturing process of a semiconductor device continued from FIG. 37B.
Figure 39:
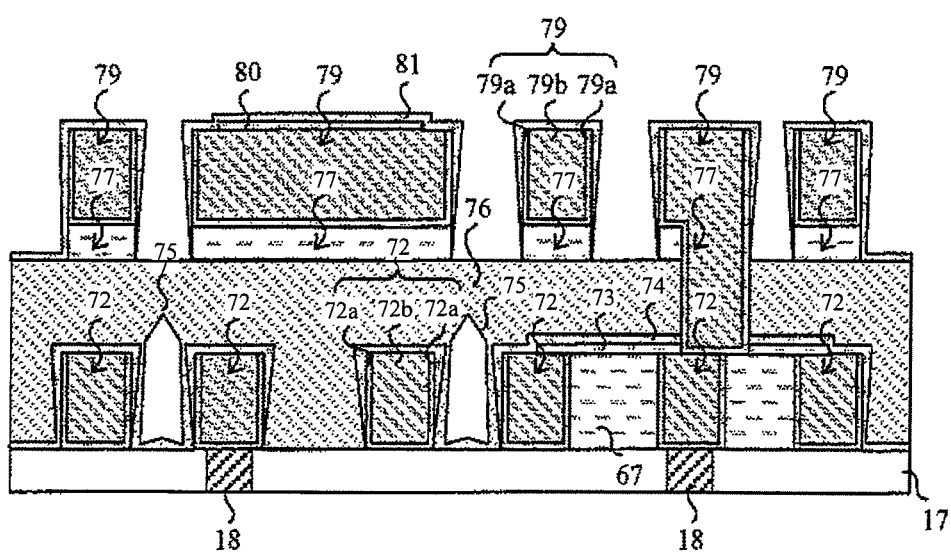
FIG. 39 is a cross-sectional view of principal parts in the manufacturing process of a semiconductor device continued from FIG. 38.

FIG. 39 depicts a wiring structure after the insulating film 77 in FIG. 38A and the insulating film 77 and insulating film 78 in FIG. 38B are removed. Similar to the case of FIG. 36, the insulating film 77 which is an organic film is removed with the reducing etching gas, and therefore, the insulating film 76 which is a plasma CVD film serves as an etch stopper and the insulating film 77 is left on a lower portion of the third layer wirings 79. In FIG. 39, in order to reduce capacitance variations and further reduce capacitance itself at the same time, the etching depth of the insulating film 77 is characteristically lower than the bottom of the third layer wirings.

Next, in the same manner as the case of FIGS. 7 to 11, a barrier insulating film 80 and a barrier insulating film 81 are formed on the third layer wirings 79. At this time, by setting a condition such that the barrier insulating film 81 is not conformal, the film thickness at a portion between nearest wirings is formed smaller than the film thickness on the third layer wirings 79, so that capacitance can be reduced.

Figure 40A:
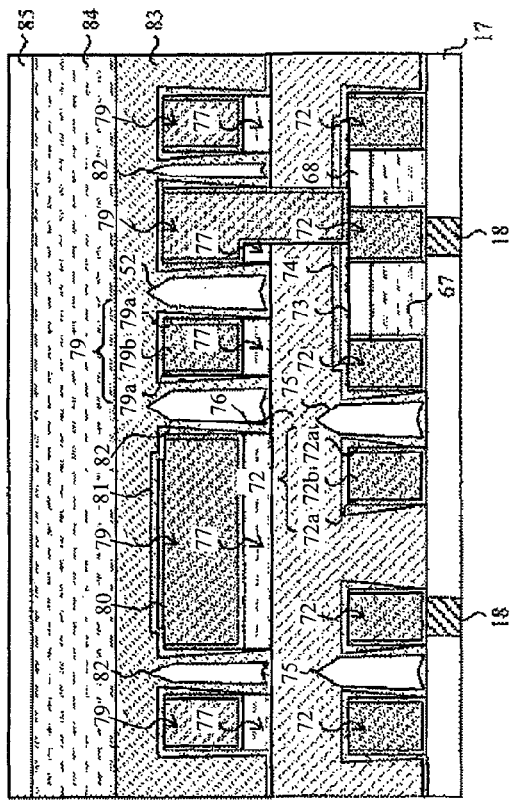
FIG. 40A is a cross-sectional view of principal parts in the manufacturing process of a semiconductor device continued from FIG. 39.
Figure 40B:
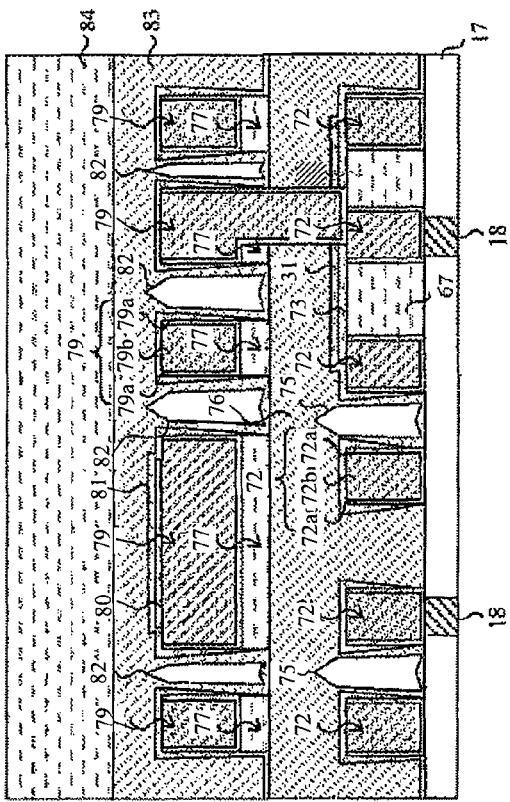
FIG. 40B is a cross-sectional view of principal parts in the manufacturing process of a semiconductor device continued from FIG. 39.

FIG. 40A depicts a wiring structure formed in the same manner as that of the case of FIGS. 37A and 37B. Gaps 82 are formed while forming an insulating film 83, and a plasma CVD film such as SiO2, SiOF or SiOC is adopted to the insulating film 83. Thereafter, an insulating film 84 which is an organic film is formed. As depicted in FIG. 40B, an insulating film 85 may be used as a CMP protective film.

(Fourth Embodiment)

Figure 41:
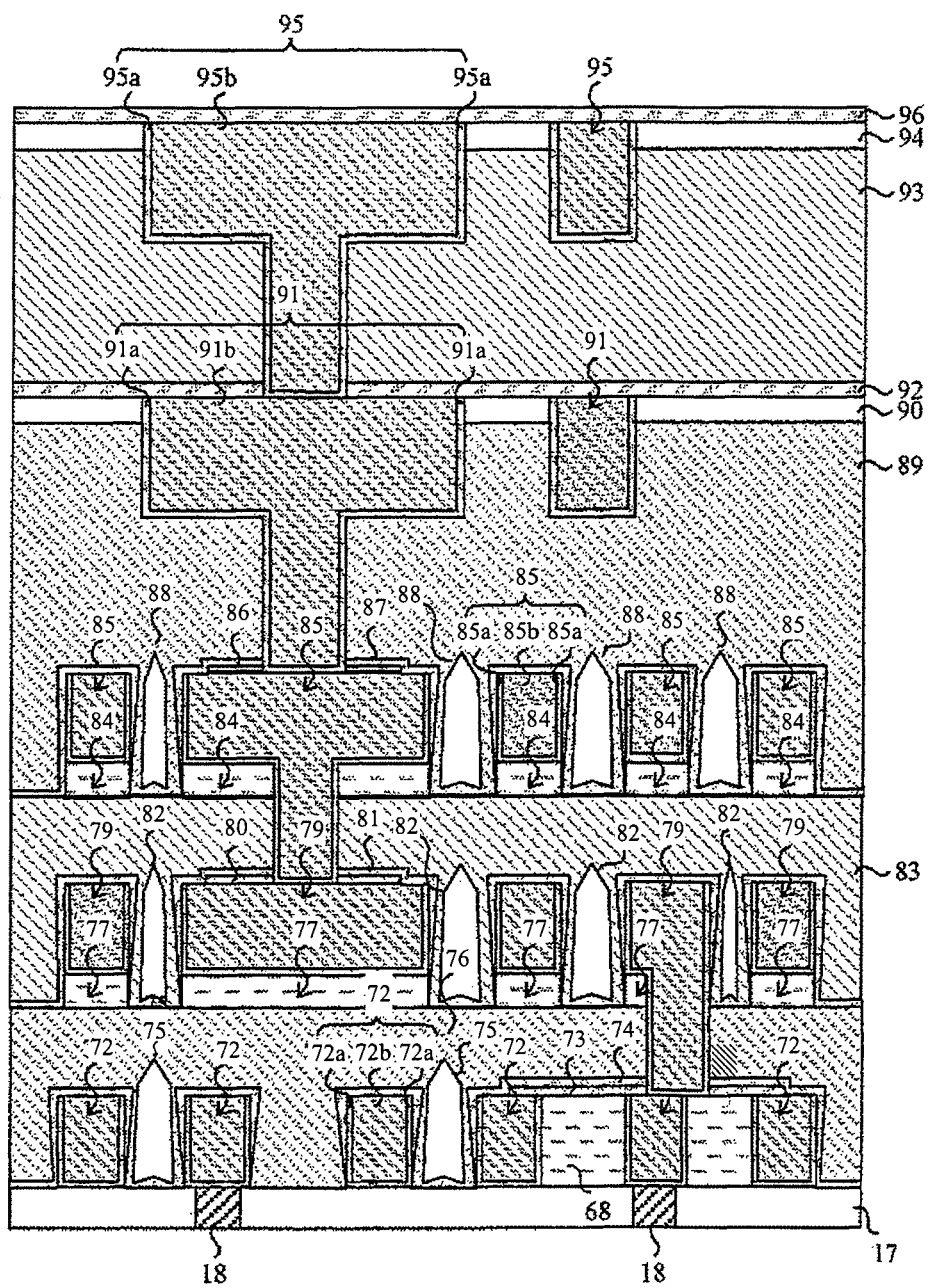
FIG. 41 is a cross-sectional view of principal parts in the manufacturing process of a semiconductor device according to another embodiment of the present invention.

FIG. 41 is a cross-sectional view of principal parts in the manufacturing process of a semiconductor device according to a fourth embodiment of the present invention. The semiconductor device of the present embodiment has a multilayer wiring structure where the structure having a wiring layer and a reservoir in which air gaps are formed between adjacent wirings and these adjacent wirings are not connected via a CMP surface like the second layer wirings 72 and the third layer wirings 79 of the third embodiment and a wiring layer formed by using a general buried wiring technique are combined. In FIG. 41, up to the process of forming an insulating film 87 on an upper portion of a fourth layer wiring 85, the manufacturing process is almost similar to those described with reference to FIGS. 37 to 40 of the second embodiment, and therefore, the description thereof is omitted and the subsequent manufacturing process will be described here.

Fifth and subsequent wiring layers are formed by using a general buried wiring technique, for example, a general Dual Damascene technique. First, after an insulating film 90 is planarized by CMP, fifth layer wirings are formed. Then, by using a Dual Damascene technique, fifth layer wirings 91 buried in wiring trenches formed in the insulating films 90, 89, 87 and 86 are formed. Then, on the insulating film 90 including upper surfaces of the fifth layer wirings 91, an insulating film 92 made of a silicon nitride film, a silicon carbide film, a silicon carbonitride film or a silicon oxynitride film is formed as a barrier insulating film. Thereafter, insulating films 93 and 94 made of a Low-K material or the like are formed on the insulating film 92. Similarly, by using a Dual Damascene technique, sixth layer wirings 95 buried in wiring trenches formed in the insulating films 92 to 94 are formed. Then, an insulating film 96 made of the same material as that of the insulating film 92, for example, silicon nitride is formed as a barrier insulating film on the insulating film 94 including upper surfaces of the sixth layer wirings 95.

Note that a film formed by using CVD, for example, a silicon oxide film, an FSG (SiOF-based material) film, an SiOC film or a porous silicon (Polus-Si) material film can be used as each of the insulating films 76, 83, 89 and 93.

In the multilayer wiring structure, in a wiring layer with a relatively-small space between adjacent wirings, that is, a relatively-small wiring pitch, the inter-wiring capacitance tends to be increased and TDDB life tends to be decreased. According to the present embodiment, in such a wiring layer where the inter-wiring capacitance tends to be increased and TDDB life tends to be decreased, no CMP surface is provided between wirings of the same layer other than the limited reservoir region, thereby increasing the TDDB life. Also, while keeping even a misaligned via contact in a proper state by using the reservoir structure, the inter-wiring capacitance can be reduced by forming an air gap in a space between nearest wirings in the wirings of the same layer.

What is claimed is

1. A manufacturing method of a semiconductor device comprising the steps of:
   (a) forming a plurality of wiring trenches in a first insulating film on a semiconductor substrate;
   (b) forming a first conductive film on the first insulating film, including on respective insides of the wiring trenches;
   (c) forming wirings formed of the first conductive film inside respective wiring trenches by removing a portion of the first conductive film outside the wiring trenches by CMP, each of the wirings formed of the first conductive film including a main conductive film made of copper;
   (d) forming a first barrier insulating film on the first insulating film and the wirings;
   (e) forming at least one reservoir position by removing the first barrier insulating film and the first insulating film except portions of the first barrier insulating film and the first insulating film in lower regions and associated peripheral regions of through holes, which are formed later and from which upper surfaces of corresponding wirings are exposed, the removal of the first insulating film being to an extent deeper than bottoms of the wirings;
   (f) forming second barrier insulating film portions on the first barrier insulating film and respective side and upper surfaces of the wirings such that the second barrier insulating film in spaces between the wirings is made thinner than the second barrier insulating film on upper surfaces of the wirings, and such that the second barrier insulating film is not formed between the wirings at bottoms of regions where the first insulating film has been removed to an extent deeper than the bottoms of the wirings;
   (g) forming a second insulating film on the second barrier insulating film portions, while leaving gaps in predetermined space regions between wirings from which the first barrier insulating film and the first insulating film have been removed;
   (h) forming the through holes penetrating through the first barrier insulating film, the second barrier insulating film, and the second insulating film to the upper surfaces of the corresponding wirings; and
   (i) forming a second conductive film inside the through holes.

2. The manufacturing method of the semiconductor device according to claim 1, wherein the first conductive film is formed by depositing a first conductive barrier film on the first insulating film, and then depositing the main conductive film on portions of the first conductive barrier film inside respective wiring trenches.

3. The manufacturing method of the semiconductor device according to claim 2, wherein the first conductive barrier film is any one of a high-melting metal nitride film, a high-melting metal film, and a stacked film thereof.

4. The manufacturing method of the semiconductor device according to claim 2, wherein the second conductive film is formed by depositing a second conductive barrier film in the through holes, and then depositing a second main conductive film made of copper on portions of the second conductive barrier film inside respective through holes.

5. The manufacturing method of the semiconductor device according to claim 4, wherein the second conductive barrier film is any one of a high-melting metal nitride film, a high-melting metal film, and a stacked film thereof.

6. The manufacturing method of the semiconductor device according to claim 1, wherein the second insulating film is one of an SiOF film and an SiOC film.

7. The manufacturing method of the semiconductor device according to claim 1, wherein the first insulating film is a stacked film of a lower layer film made of any one of a silicon nitride film, a silicon carbide film, a silicon carbonitride film and a silicon oxynitride film, an intermediate film made of any one of an SiOF film and an SiOC film, and an upper layer film made of a silicon oxide film.

8. The manufacturing method of the semiconductor device according to claim 1, wherein the first and second barrier insulating films are each any one of a silicon nitride film, a silicon carbide film, a silicon carbonitride film, and a silicon oxynitride film.

9. The manufacturing method of the semiconductor device according to claim 2, wherein in the step (e), a photo-resist pattern is formed on the first barrier insulating film in the lower regions and the associated peripheral regions of the through holes, and the first barrier insulating film and the first insulating film are removed by dry etching using the photo-resist pattern as a mask.

10. The manufacturing method of the semiconductor device according to claim 2, wherein in the step (e), after a third insulating film is formed on the first barrier insulating film, a photo-resist pattern covering formation regions and associated peripheral regions of the through holes is formed, the third insulating film is etched using the photo-resist pattern as a mask, and after the photo-resist pattern is removed, removal of the first barrier insulating film and the first insulating film being performed by dry etching using the etched third insulating film as a mask.

11. The manufacturing method of the semiconductor device according to claim 10, wherein the third insulating film is a silicon oxide film or an SiOC film.

* * * * *